(12) United States Patent
Kasai

(10) Patent No.: US 6,600,674 B2
(45) Date of Patent: Jul. 29, 2003

(54) FERROELECTRIC MEMORY DEVICE INCLUDING A CONTROLLER

(75) Inventor: Masanori Kasai, Kanagawa (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 0 days.

(21) Appl. No.: 10/056,206

(22) Filed: Jan. 28, 2002

(65) Prior Publication Data
US 2002/0101756 A1 Aug. 1, 2002

(30) Foreign Application Priority Data
Jan. 29, 2001 (JP) ...................................... 2001-020178

(51) Int. Cl.[7] ............................................. G11C 11/22
(52) U.S. Cl. .................... 365/145; 365/149; 365/230.06
(58) Field of Search ................................. 365/149, 145, 365/210, 230.06, 203, 189.01

(56) References Cited

U.S. PATENT DOCUMENTS 5,680,344 A * 10/1997 Seyyedy ...................... 365/145
5,917,746 A * 6/1999 Seyyedy ...................... 365/145
5,953,277 A * 9/1999 Mukunoki et al. ........... 365/210
6,392,918 B2 * 5/2002 Braun et al. ................. 365/145

OTHER PUBLICATIONS

"Low–Power High–Speed LSI Circuits & Technology", Realize Co., Ltd., pp. 234–240.

* cited by examiner

Primary Examiner—Hoai Ho
Assistant Examiner—Gene N. Auduong
(74) Attorney, Agent, or Firm—Venable LLP; Michael A. Sartori

(57) ABSTRACT

Bit lines to which memory cells having a capacitor formed of a ferroelectric substance are connected are each divided into a plurality of line segments. These line segments can be electrically connected by transistors. To read data from the memory cells to the bit lines, the transistors are rendered conductive, and the parasitic capacitances of the bit lines are increased. To amplify data on a bit line using a sense amplifier, the transistors are rendered off and the parasitic capacitances of the bit lines are reduced.

19 Claims, 20 Drawing Sheets

PRIOR ART

FERROELECTRIC MEMORY DEVICE INCLUDING A CONTROLLER

BACKGROUND OF THE INVENTION

1. Field of the Invention

The present invention relates to a ferroelectric memory device.

2. Description of the Related Art

Conventionally, FeRAM (Ferroelectric Random Access Memory) is well known ferroelectric memory. One example is the 2-transistor 2-capacitor/1-bit type. In FeRAM of this type, pairs of memory cells, each of which is constituted by a transistor and a capacitor, are used to store binary information sets.

FeRAM is disclosed in the following well known reference: "Low Power Consumption, High-speed LSI Technique", Realize Co., Ltd., pp. 234–240.

A memory cell array commonly used for FeRAM includes a matrix-shaped arrangement of memory cells. The structure of one column of such a memory cell array is shown in FIG. 18. As is shown in FIG. 18, for FeRAM 2000, memory cells M0, M1, . . . respectively include selection transistors T0, T1, . . . and ferroelectric capacitors C0, C1, . . . . The ferroelectric capacitors C0, C1, . . . store directionally polarized binary data.

In FeRAM of the 2-transistor 2-capacitor/1-bit type, binary data having different values are stored in the ferroelectric capacitors (e.g., the capacitors C0 and C1) of paired memory cells (e.g., the memory cells M0 and M1).

FIG. 19 is a timing chart for the data reading operation performed for FeRAM 2000. In FIG. 19, L denotes a ground potential and H denotes a power voltage Vcc. Vh denotes a potential that is higher than the power voltage Vcc the equivalent of the threshold value Vt of the selection transistors T0, T1 . . . .

First, at time t1, the potential on a precharge control line PCHG is set to L, and transistors PCT0 and PCT1 are rendered off. At this time, bit lines BL0 and BL1 are placed in the floating state.

Next, at time t2, the potentials on word lines WL0 and WL1 are set to Vh, and the selection transistors T0 and T1 are rendered on.

When at time t3 the potential on a plate line PL0 is set to H, the potential on the plate line PL0 is applied to the bit lines BL0 and BL1 via the ferroelectric capacitors C0 and C1 and the selection transistors T0 and T1, so that a read potential is generated across the bit lines BL0 and BL1. Since the capacitances of the ferroelectric capacitors C0 and C1 differ depending on the polarization direction, the values of the read potentials generated across the bit lines BL0 and BL1 also differ in accordance with the polarization direction.

At time t4, the potential of a signal SAE is set to H, and a sense amplifier SA is activated. Then, the potentials across the bit lines BL0 and BL1 are amplified.

At time t5, the potential on the plate line PL0 is returned to L, and at the same time, the potential of a column selection signal SEL is set to H. Then, bit line selection transistors SET0 and SET1 are rendered on and the read potentials on the bit lines BL0 and BL1 are output to a data bus 2210.

At time t6, the potential on the precharge control line PCHG is set to H, and the potentials on signal lines SAE and SEL are set to L. Then, the transistors PCT0 and PCT1 are rendered on to ground the bit lines BL0 and BL1 and the sense amplifier SA halts the output of read data.

Finally, at time t7, the potentials on the word lines WL0 and WL1 are set to L, and the selection transistors T0 and T1 are rendered off.

FIG. 20 is a conceptual diagram for explaining the state shifting of a ferroelectric capacitor. The horizontal axis represents a voltage V, and the vertical axis represents polarization Pr [$\mu C/cm^2$]. As is shown in FIG. 20, the relationship existing between the voltage V and the polarization Pr describes a hysteresis curve H, and the inclination of the hysteresis curve H corresponds to the capacitance [q/V] across the ferroelectric capacitor.

In FIG. 20, assume that the coordinates of an intersection A of the hysteresis curve H and the Pr axis (area of Pr>0) are (0, p0). Further, when a linear line S1 is drawn so that it passes through point B(Vcc,p0) and intersects linear line Pr=p0 at an angle of θ, assume that the coordinates of an intersection C of the linear line S1 and the ascending segment of the hysteresis curve H are (v1, p1). The angle θ is then determined in accordance with the capacitance on the bit line. The V coordinate v1 of the point C matches the inter-terminal voltage at the ferroelectric capacitor, and the difference Vcc-v1 between the V coordinates of the points B and C matches the potential on the bit line. Therefore, when Pr>0 (the stored value is "0"), the potential V0 output to the bit line is represented by Vcc-v1.

Further assume in FIG. 20 that the coordinates of an intersection D of the hysteresis curve H and the Pr axis (area of Pr>0) are (0, p2). Furthermore, when a linear line S2 is drawn so that it passes through point E (Vcc, p2) and intersects a linear line Pr=p2 at an angle θ, the coordinates of an intersection F of the linear line S1 and the ascending segment of the hysteresis curve H are (v2, p3). Also, in this case, the V coordinates v2 of the point F match the inter-terminal voltage at the ferroelectric capacitor, and the difference Vcc-v2 between the V coordinates of the points E and F matches the bit line potential. Therefore, when Pr<0 (the stored value is "1"), the potential V1 output to the bit line is represented by Vcc-v2.

As is apparent from FIG. 20, V0<V1 is established, and the angle θ is such that the read margin ΔV is at its maximum. In order to increase the angle θ, only the capacitance on the bit line need be increased.

FIG. 21 is a graph showing the relationship between the reading margin ΔV and a ratio Cbl/Cs of the capacitance Cbl on the bit line to the capacitance Cs on the ferroelectric capacitor. As is apparent from FIG. 21, when Cbl/Cs is between 4 and 5, the maximum reading margin is obtained. Further, when the reading margin is increased, the reliability of the data read is increased and the yield provided by the FeRAM is improved.

The capacitances Cbl on the bit lines BL0 and BL1 are the junction capacitances of the transistors T0, T1, . . . and PCT0, PCT1, . . . , which are connected to the bit lines BL0, BL1, . . . , or are the parasitic capacitances on the bit lines BL0, BL1, . . . . In most cases, the capacitances on the bit lines BL0, BL1, . . . are derived from the junction capacitances provided by the selection transistors T0, T1, . . . . For conventional FeRAMs, several hundreds of selection transistors are connected to one bit line in order to increase the capacitances Cbl placed on the bit lines BL0, BL1, . . . .

However, when the capacitances Cbl placed on the bit lines BL0, BL1, . . . are increased, this is accompanied by an increase in the power consumed by the sense amplifier SA (see FIG. 18). For data reading, the potentials on the bit lines BL0, BL1, . . . are amplified until they reach the level of the power potential Vcc or the ground potential, and this amplification to the power potential Vcc is implemented by a current supplied to the bit lines BL0, BL1, . . . by the sense amplifier SA. Therefore, as the capacitances placed on the bit lines BL0, BL1, . . . are large, the consumption of power by the sense amplifier SA is increased.

For these reasons, a demand exists for ferroelectric memory for which the read data is reliable and the consumed power is small.

SUMMARY OF THE INVENTION

According to the present invention, a ferroelectric memory device comprises:

- a plurality of memory cells, arranged in the shape of a matrix, including capacitors, for which a ferroelectric substance is used, on which binary data is stored while the capacitors are in a polarized state;
- a plurality of bit lines, connected to several of the memory cells aligned in a first direction;
- a plurality of word lines, connected in series to the memory cells aligned in a second direction perpendicular to the first direction;
- a plurality of plate lines, which correspond to the memory cells and which are electrically connected to the capacitors;
- a sense amplifier for amplifying a potential applied to each of the bit lines; and
- a controller for, when potentials consonant with data stored in one of the memory cells are applied to one of the bit lines, electrically connecting the memory cell that outputs the potential to a predetermined number of other memory cells via the bit line, or for, when the sense amplifier amplifies the potential applied to the bit line, reducing to less than the predetermined number the number of memory cells that are to be electrically connected via the bit line to the memory cell the source of the potential.

DETAILED DESCRIPTION OF THE PREFERRED EMBODIMENTS

The preferred embodiments of the present invention will now be described while referring to the accompanying drawings. The sizes, the shapes and the positional relationships of individual components are shown merely schematically, details being limited to those required to make the present invention understandable, while the numerical conditions in the following explanation are merely examples.

First Embodiment

In accordance with a first embodiment of the present invention, a 2-transistor 2-capacitor/1-bit type FeRAM will now be explained as a semiconductor device.

Figure 1:
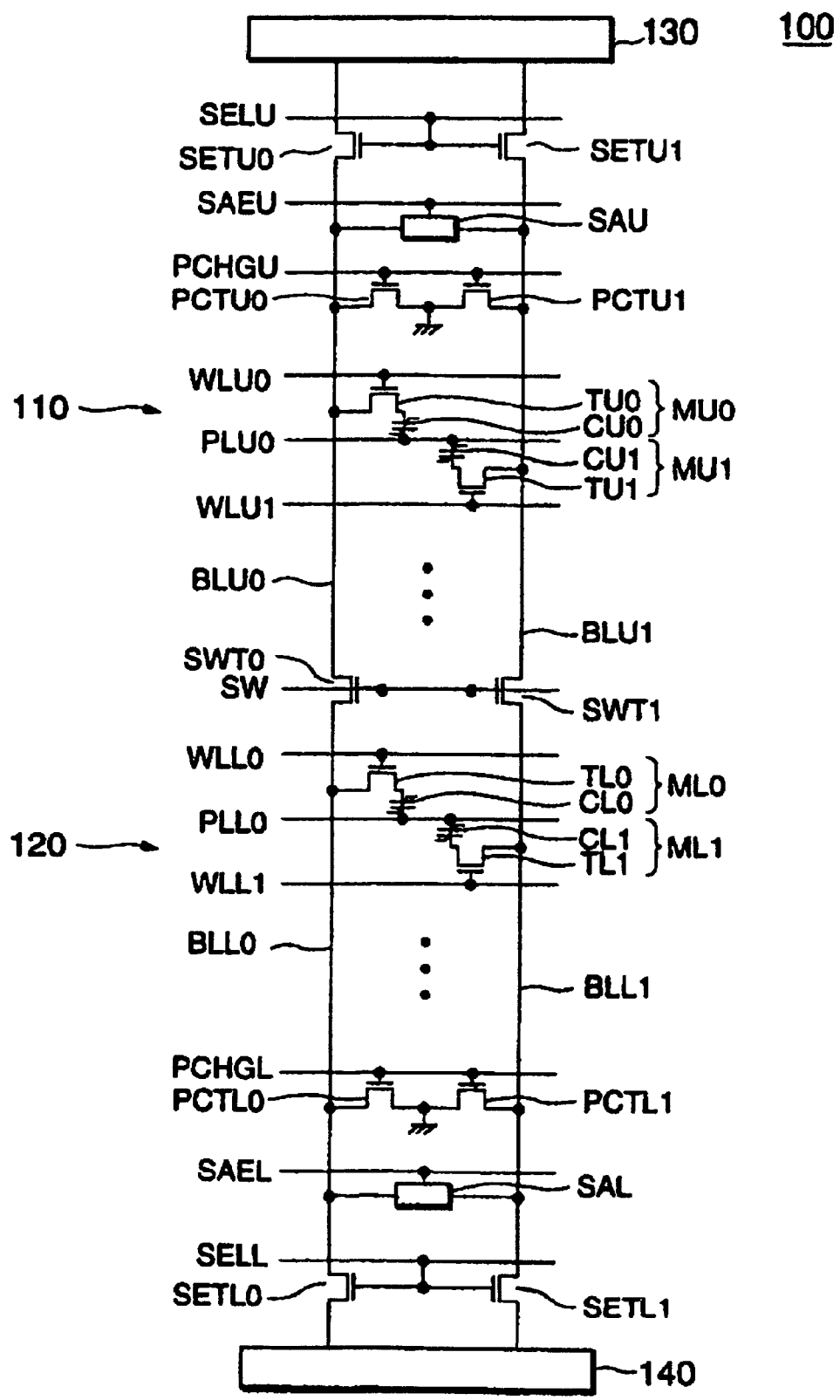
FIG. 1 is diagram showing the configuration of a ferroelectric memory device according to a first aspect of the present invention.

FIG. 1 is a circuit diagram showing the structure of one column of an FeRAM memory cell array according to this embodiment.

As is shown in FIG. 1, each column of a memory cell array of an FeRAM 100 includes two memory cell blocks 110 and 120 and switch transistors SWT0 and SWT1. The first block 110 of each column includes memory cells MU0, MU1, . . . , precharge transistors PCTU0 and PCTU1, bit line selection transistors SETU0 and SETU1, a sense amplifier SAU and bit lines (line segments) BLU0 and BLU1. The second block 120 of each column includes memory cells ML0, ML1, . . . , precharge transistors PCTL0 and PCTL1, bit line selection transistors SETL0 and SETL1, a sense amplifier SAL and bit lines (line segments) BLL0 and BLL1. In addition, in the first block 110 word lines WLU0, WLU1, ..., plate lines PLU0 and PLU1, a precharge control line PCHGU, a selection line SELU and an activated signal line SAEU are provided as common control lines; while in the second block 120, word lines WLL0, WLL1, ..., plate lines PLL0 and PLL1, a precharge control line PCHGL, a selection line SELL and an activated signal line SAEL are provided as common control lines. In addition, a switching control line SW is provided as a common control line for the switch transistors SWT0 and SWT1.

In this embodiment, the number of memory cells MU0, MU1, ... in the first block 110 matches the number of memory cells ML0, ML1, ... in the second block 120. Thus, the same number of memory cell transistors are connected to the bit lines BLU0, BLU1, BLL0 and BLL1. And as is described above, since the source of most of the capacitance on each bit line is the junction capacitance of a the memory cell transistor, the capacitances on the bit lines are the same. In this embodiment, the sum of the parasitic capacitances on the bit lines BLU0 and BLU1 and the sum of the parasitic capacitances on the bit lines BLL0 and BLL1 are set large enough to obtain a satisfactory reading margin ΔV (see FIG. 21).

The word lines WLU0, WLU1, ... and the plate lines PLU0, PLU1, ... in the first block 110 are arranged in parallel in the row direction in the memory cell array. The word lines WLU0, WLU1, ... are paired and arranged so that a plate line is positioned between the two word lines. Similarly, the word lines WLL0, WLL1 ... and the plate lines PLL0, PLL1, ... in the second block 120 are arranged in parallel following the row direction in the memory cell array. The word lines WLL0, WLL1, ... are paired and arranged so that one plate line is positioned between the two word lines.

The bit lines BLU0 and BLU1 of the first block 110 are paired and arranged in parallel in the columnar direction in the memory cell array. Similarly, the bit lines BLL0 and BLL1 in the second block 120 are paired and arranged in the columnar direction in the memory cell array.

The memory cells MU0, MU1, ... in the first block 110 are arranged at locations whereat the word lines WLU0, WLU1, ... intersect the bit lines BLU0 and BLU1. The memory cells MU0, MU1, ... respectively include MOS transistors TU0, TU1, ... and ferroelectric capacitors CU0, CU1, .... For the MOS transistors TU0, TU1, ..., gates are connected to corresponding word lines, drains are connected to corresponding bit lines, and sources are connected on one side to the ends of corresponding ferroelectric capacitors CU0, CU1, .... On the other side, the ends of the ferroelectric capacitors CU0, CU1, ... are connected to a corresponding plate line. Similarly, in the second block 120 the memory cells ML0, ML1, ... are arranged at locations whereat the word lines WLL0, WLL1, ... intersect the bit lines BLL0 and BLL1. For the MOS transistors TL0, TL1, ..., gates are connected to corresponding word lines, drains are connected to corresponding bit lines, and sources are connected on one side to the ends of corresponding ferroelectric capacitors CL0, CL1, .... The other ends of the ferroelectric capacitor CL0, CL1, ... are connected to a corresponding plate line.

The precharge control line PCHGU, the selection signal line SELU and the activated signal line SAEU of the first block 110 are arranged perpendicular to the bit lines BLU0 and BLU1. Similarly, the precharge control line PCHGL, the selection signal line SELL and the activated signal line SAEL of the second block are arranged perpendicular to the bit lines BLL0 and BLL1.

For the precharge transistors PCTU0 and PCTU1 of the first block 110, gates are connected to the precharge control line PCHGU, sources are connected to corresponding bit lines, and drains are grounded. Similarly, for the bit line selection transistors SETL0 and SETL1 in the second block 120, gates are connected to the selection line SELL, sources are connected to corresponding bit lines, and drains are connected to a data bus 140.

For the bit line selection transistors SETU0 and SETU1 in the first block 110, gates are connected to the selection line SELU, sources are connected to corresponding bit lines, and drains are connected to a data bus 130. Similarly, for the bit line selection transistors SETL0 and SETL1 in the second block 120, gates are connected to the selection line SELL, sources are connected to corresponding bit lines, and drains are connected to a data bus 140.

The sense amplifier SAU in the first block 110 is activated when the level of the signal SAEU goes high and amplifies the potential difference between the bit lines BLU0 and BLU1. Similarly, the sense amplifier SAL in the second block 120 is activated when the level of the signal SAEL goes high, and amplifies the potential difference between the bit lines BLL0 and BLL1. In this embodiment, when data is read from the memory cells MU0, MU1, ... the sense amplifier SAU in the first block 110 amplifies the potential difference. And when data is read from the memory cells ML0 and ML1 in the second block 120, the sense amplifier SAL in the second block 120 amplifies the potential difference. In this embodiment, since no limitations are placed on the types of sense amplifiers SAU and SAL that can be used, a detailed explanation of the internal structure will not be given.

For the switch transistors SWT0 and SWT1, gates are connected to the switching control line SW, either sources or drains are connected to corresponding bit lines in the first block 110, and likewise, either sources or drains are connected to corresponding bit lines in the first block 110.

Figure 2:
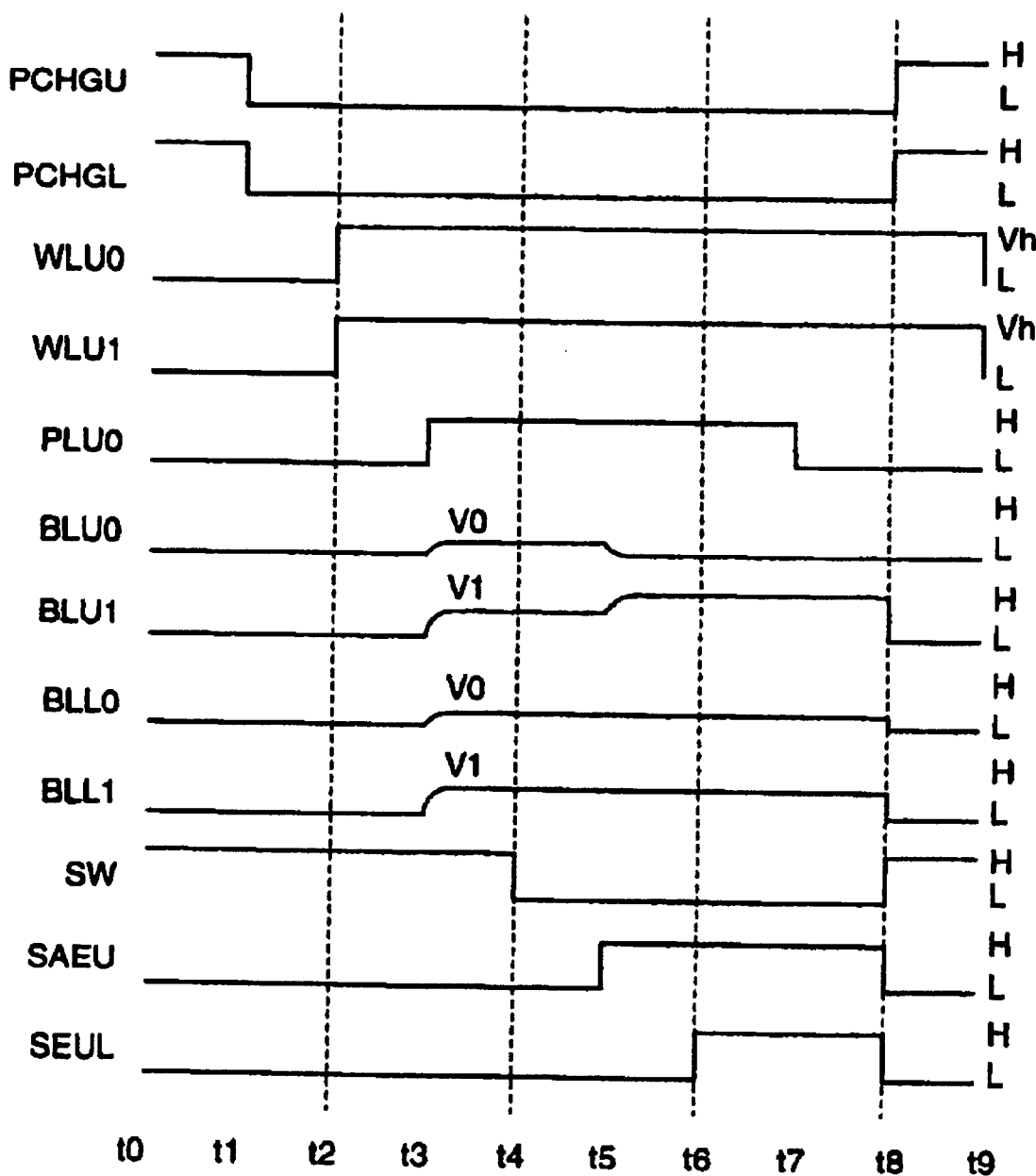
FIG. 2 is a timing chart for explaining the operation of the ferroelectric memory device according to the first embodiment of the present invention.

The reading operation performed in the FeRAM 100 in FIG. 1 will now be described by using the timing chart in FIG. 2. In this embodiment, an explanation will be given for a case wherein data is read from the memory cells MU0 and MU1. In FIG. 2, L denotes a ground potential and H denotes a power voltage Vcc, and Vh denotes a potential that is higher than the power voltage Vcc by an amount corresponding to the threshold value Vt of the transistors TU0 and TU1 in the memory cell.

In the initial state (time t0), the potential of the switching control line SW is at level H. Since the switch transistors SWT0 and SWT1 are on, the bit lines BLU0 and BLL0 are connected together, as are the bit lines BLU1 and BLL1.

In order for data to be read from the memory cells MU0 and MU1, first, at time t1 the potentials of the precharge control lines PCHGU and PCHGL are set to level L. Thus, since the transistors PCTU0, PCTU1, PCTL0 and PCTL1 are rendered off, the bit lines BLU0, BLU1, BLL0 and BLL1 are set to the floating state.

At time t2, the word lines WLU0 and WLU1 are set to level Vh. Thus, the transistors TU0 and TU1 of the memory cells MU0 and MU1 are rendered on, and on one side the ends of the ferroelectric capacitors CU0 and CU1 are connected to the bit lines BLU0 and BLU1. The word lines WLU0 and WLU1 are set to Vh level, not to level H, because the output voltages (drain voltages) of the transistors TU0 and TU1 are lower by the equivalent of Vt than the input voltages (source voltages).

Sequentially, at time t3, the plate line PLU0 is set to level H. Thus, the potential of the plate line PLU0 is applied to the bit lines BLU0 and BLU1 via the ferroelectric capacitors CU0 and CU1 and the transistors TU0 and TU1, and as a result, a read potential (V0 or V1) is generated across the bit lines BLU0 and BLU1. As is described above, since the switch transistors SWT0 and SWT1 are on, the bit lines BLU0 and BLU1 are connected to the bit lines BLL0 and BLL1, and therefore, the parasitic capacitances on the bit lines BLU0 and BLU1 become satisfactorily large due to the selection transistors TL0, TL1, . . . , which are connected to the bit lines BLL0 and BLL1. Accordingly, the reading margin ΔV=V1−V0 becomes satisfactorily large.

At time t4, the switching control line SW is set to level L, and then, since the switch transistors SWT0 and SWT1 are rendered off, the bit line BLU0 is disconnected from the bit line BLL0 and the bit line BLU1 is disconnected from the bit line BLL1. Therefore, on the bit lines BLU0 and BLU1 the parasitic capacitances are half those on the lines when the switch transistors SWT0 and SWT1 are on.

At time t5, the signal SAEU is set to level H, and the sense amplifier SAU is activated, and as a result, the potential difference between the bit lines BLU0 and BLU1 is amplified. In this embodiment, since at amplification time the parasitic capacitances on the bit lines BLU0 and BLU1 are small, only a small current is supplied by the sense amplifier SAU to the bit lines BLU0 and BLU1, and accordingly, at the sense amplifier SAU the consumption of power is low.

At time t6, the bit line selection signal line SELU is set to level H. following which the transistors SETU0 and SETU1 are rendered on and the potentials on the bit lines BLU0 and BLU1 are output to the data bus 130.

At time t7, the potential on the plate line PLU0 is returned to level L.

At time t8, the potentials of the precharge control lines PCHGU and PCHGL are returned to level H and the potentials of the signals SAEU and SELU are set to level L. As a result, to ground the bit lines BLU0, BLU1, BLL0 and BLL1 the transistors PCTU0, PCTU1, PCTL0 and PCTL1 are rendered on, and the sense amplifier SAU halts the output of read data. Also, at time t8 the switching control line SW is returned to level H, and since the switch transistors SWT0 and SWT1 are rendered on, the bit lines BLU0 and BLL0 are connected together, as are the bit lines BLU1 and BLL1.

At time t9, the potentials on the word lines WLU0 and WLU1 are set to level L, the transistors TU0 and TU1 are rendered off, and the reading operation is terminated.

The operation for the reading of data from the memory cells MU2, MU3, . . . in the first block 110 is performed substantially the same as the reading operation for the memory cell MU1.

In order to read data from the memory cells ML0, ML1, . . . of the second block 120, the switch transistors SWT0 and SWT1 are rendered off (see t4 in FIG. 2), and the sense amplifier SAL of the second block 120 is activated (corresponds to time t5) to amplify the data that has been read. The amplified data are then output to a data bus 140 via the transistors SETL0 and SETL1 (corresponds to time t6). That is, to amplify the read data, the sense amplifier corresponding to the memory cell from which data is to be read, i.e., the sense amplifier that is connected to the pertinent memory cell after the switch transistors SWT0 and SWT1 have been rendered off, is employed.

As is described above in this embodiment, in order to read data from the transistor of the memory cell of the FeRAM 100, the switch transistors SWT0 and SWT1 are rendered on, and the bit lines BLU0 and BLL0 and the bit lines BLU1 and BLL1 are connected. Thus, a satisfactorily large capacitance can be obtained for the bit lines BLU0 and BLU1 at the time of reading (see time t3). Since a satisfactorily large reading margin ΔV can be obtained, the yield of the FeRAM can be improved.

Further, for the FeRAM in this embodiment, in order to employ the sense amplifiers SAU and SAL to amplify the data read on the bit line, the switch transistors SWT0 and SWT1 are rendered off to disconnect the bit lines BLU0 and BLL0 and the bit lines BLU1 and BLL1. As is described above, since the capacitances on the bit lines BLU0 and BLL0 are the same as those on the bit lines BLU1 and BLL1, the capacitance level at the amplification time (see time t5) can be half that at the data reading time, and the power consumed by the sense amplifiers SAU and SAL can be reduced.

As is described above in this embodiment, the number of memory cells in the first block 110 equals the number of memory cells in the second block 120. However, it is not absolutely necessary for the number of memory cells in the block 110 to equal those in block 120. When, for example, the ratio of the number of memory cells of the first block 110 to the number of memory cells of the second block 120 is defined as 1:2, the ratio of the capacitances on the bit lines BLU0 and BLU1 in the first block 110 to the capacitances on the bit lines BLL0 and BLL1 in the second block 120 is substantially 1:2. As is described above, for the most part the capacitances on the bit lines correspond to the junction capacitances of the memory cell transistors, and therefore, the consumption of power when data is read from the memory cells MU0, MU1, . . . in the first block 110 is reduced to near a third of that which is consumed conventionally, while the consumption of power when data is read from the memory cells ML0, ML1, . . . in the second block 120 drops to near two thirds of that which is consumed conventionally. Therefore, when frequently read data are stored in the memory cells MU0, MU1, . . . in the first block 110 and less frequently read data is stored in the memory cells ML0, ML1, . . . in the second block 120, a further reduction in the consumption of power can be realized when the number of memory cells in the block 110 corresponds to that in the block 120. When, for example, in one FeRAM, an area including a smaller number of memory cells for one bit line is provided as a program storage area, and an area including a larger number of memory cells is provided as a data storage area, the consumption of power can be reduced. This is because, generally, in the program storage area the access frequency is higher.

Second Embodiment

A 2-transistor 2-capacitor/1-bit type FeRAM will now be explained as a semiconductor device according to a second embodiment of the present invention.

The second embodiment differs from the first embodiment in that common a sense amplifier is used for the blocks.

Figure 3:
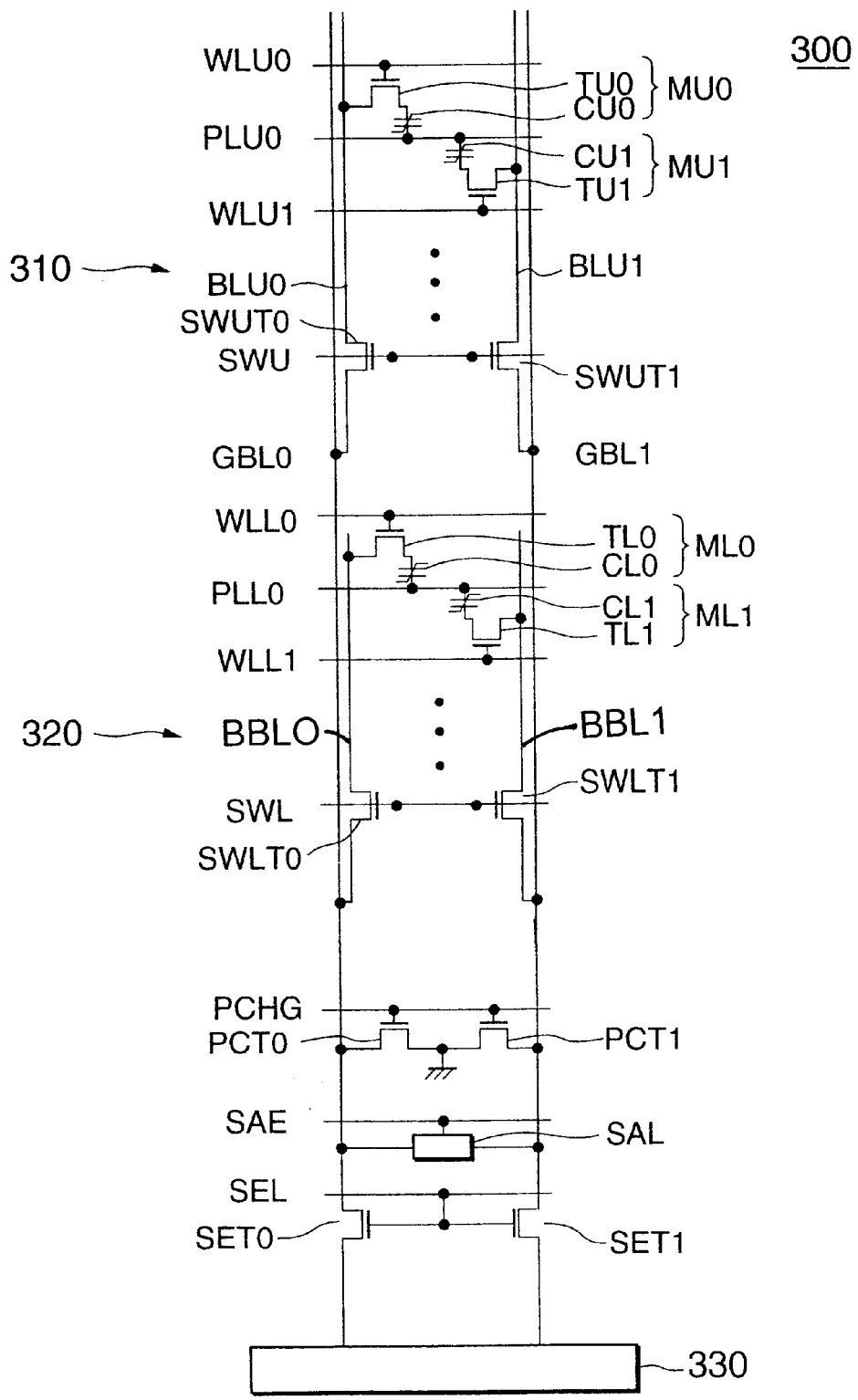
FIG. 3 is a diagram showing the configuration of a ferroelectric memory device according to a second embodiment of the present invention.

FIG. 3 is a circuit diagram showing the structure of one column of a memory cell array of the FeRAM according to this embodiment.

As is shown in FIG. 3, one column of a memory cell array of an FeRAM 300 includes two memory cell blocks 310 and 320, precharge transistors PCT0 and PCT1, a sense amplifier SA, bit line selection transistors SET0 and SET1 and global bit lines GBL0 and GBL1. The first block 310 includes memory cells MU0, MU1, . . . , switch transistors SWUT0 and SWUT1 and bit lines (support lines) BLU0 and BLU1. Similarly, the second block 320 includes memory cells ML0, ML1, . . . , switch transistors SWL0 and SWL1, and bit lines (support lines) BLL0 and BLL1. Word lines WLU0, WLU1, . . . , plate lines PLU0, PLU1, and switching control lines SWU are provided as common control lines for the first block 310 of each column. Similarly, word lines WLL0, WLL1, . . . , plate lines PLL0, PLL1, . . . and a switching control line SWL are provided as common control lines for the second block 320 for each column. Further, a precharge control line PCHG, an activated signal line SAE and a selection line SEL are provided as common control lines for precharge transistors PCT0 and PCT1, a sense amplifier SA and bit line selection transistors SET0 and SET1.

In this embodiment, the number of the memory cells MU0, MU1, . . . in the first block 310 matches the number of the memory cells ML0, ML1, . . . in the second block 320. Thus, these bit lines have the same capacitance. In this embodiment, the sum of the parasitic capacitances of the bit lines BLU0 and BLL1 and the sum of the parasitic capacitances of the bit lines BLL0 and BLL1 are set to values large enough to obtain a satisfactory reading margin ΔV (see FIG. 21).

The word lines WLU0, WLU1, . . . and the plate lines PLU0, PLU1, . . . of the first block 310 are arranged in parallel in the row direction of the memory cell array. The word lines WLU0, WLU1, . . . are paired and arranged so that one plate line is positioned between the two word lines. Similarly, the word lines WLL0, WLL1, . . . and the plate lines PLL0, PLL1, . . . of the second block 320 are arranged in parallel in the row direction of the memory cell array. The word lines WLL0, WLL1, . . . are paired and arranged so that one plate line is positioned between the two word lines.

The bit lines BLU0 and BLU1 of the first block 310 are paired and arranged in parallel in the columnar direction of the memory cell array. Similarly, the bit lines BLL0 and BLL1 of the second block 320 are paired and arranged in the columnar direction of the memory cell array.

The global bit lines GBL0 and GBL1 are connected via the switch transistors SWUT0 and SWUT1 to the bit lines BLU0 and BLU1 in the first block 310, and are also connected via the switch transistors SWLT0 and SWLT1 to the bit lines BLL0 and BLL1 of the second block 320. The gates of the switch transistors SWUT0 and SWUT1 are connected to the switching control line SWU, and the gates of the switch transistors SWLT0 and SWLT1 are connected to the switching control line SWL.

The memory cells MU0, MU1, . . . in the first block 310 are arranged at locations whereat the word lines WLU0, WLU1, . . . intersect the bit lines BLU0 and BLU1. The memory cells MU0, MU1, . . . respectively include MOS transistors TU0, TU1, . . . and ferroelectric capacitors CU0, CU1, . . . . For the MOS transistors TU0, TU1, . . . , gates are connected to corresponding word lines, drains are connected to corresponding bit lines, and sources are connected on one side to the ends of corresponding ferroelectric capacitors CU0, CU1, . . . . The other ends of the ferroelectric capacitors CU0, CU1, . . . are connected to a corresponding plate line. Similarly, the memory cells ML0, ML1, . . . in the second block 320 are arranged at the locations where the word lines WLL0, WLL1, . . . intersect the bit lines BLL0 and BLL1. For the MOS transistors TL0, TL1, . . . , gates are connected to corresponding word lines, drains are connected to corresponding bit lines, and on one side sources are connected to the ends of corresponding ferroelectric capacitors CL0, CL1, . . . . The other ends of the ferroelectric capacitors CL0, CL1, . . . are connected to a corresponding plate line.

For the precharge transistors PCT0 and PCT1, gates are connected to the precharge control line PCHG, sources are connected to corresponding bit lines, and drains are grounded.

For the bit line selection transistors SET0 and SET1, gates are connected to the selection line SEL, sources are connected to corresponding bit lines, and drains are connected to a data bus 330.

The sense amplifier SA is activated when the level of the signal SAE is high, and amplifies the potentials of the bit lines GBL0 and GBL1. In this embodiment, since no limitation is placed on the type of sense amplifier SA that can be used, a detailed explanation of the internal structure will not be given.

Figure 4:
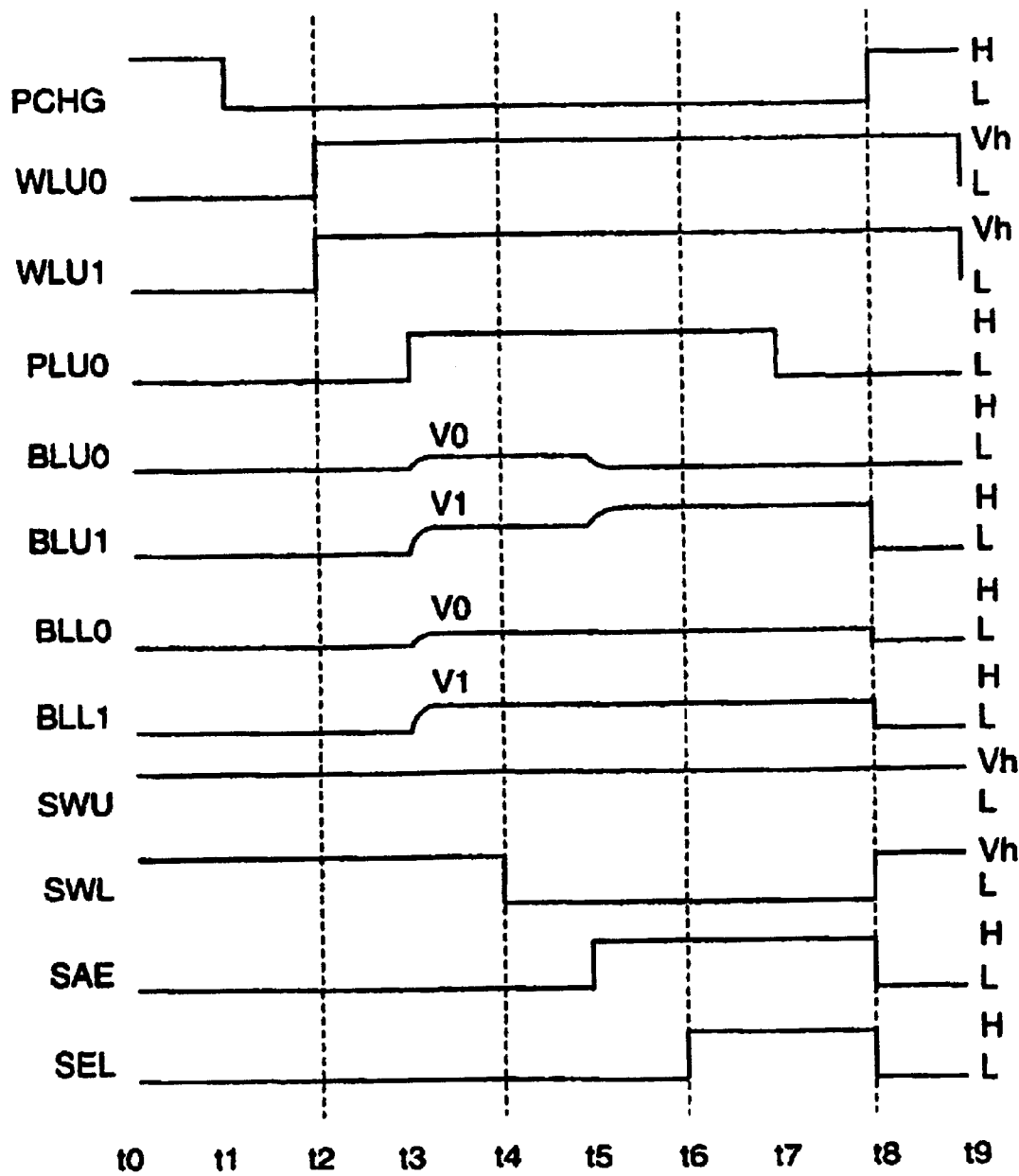
FIG. 4 is a timing chart for explaining the operation of the ferroelectric memory device according to the second embodiment of the present invention.

The reading operation performed for the FeRAM 300 in FIG. 3 will now be described by using the timing chart in FIG. 4. In this embodiment, an explanation will be given for a case wherein the data is read from the memory cells MU0 and MU1. In FIG. 4, L denotes a ground potential and H denotes a power voltage Vcc. Vh denotes a potential that is higher than the power voltage Vcc by a value equivalent to the threshold value Vt of the transistors TU0 and TU1 of the memory cell.

In the initial state (time t0), the potentials of the switching control lines SWU and SWL are at level H. Thus, the bit lines of blocks 710-A, 710-B, 710-C, . . . are connected to the global bit lines.

In order to read data from the memory cells MU0 and MU1, first, at time t1 the potential on the precharge control line PCHG is set to level L. Thus, since the transistors PCT0 and PCT1 are rendered off, the global bit lines GBL0 and GBL1 are set to the floating state.

At time t2, the word lines WLU0 and WLU1 are set to level Vh. Thus, the transistors TU0 and TU1 of the memory cells MU0 and MU1 are rendered on, and the ends of the ferroelectric capacitors CU0 and CU1 on one side are connected to the bit lines BLU0 and BLU1. The word lines WLU0 and WLU1 are set to level Vh instead of level H because the output voltages (drain voltages) of the transistors TU0 and TU1 are lower than the input voltages (source voltages) by an amount equal to Vt.

Sequentially, at time t3, the plate line PLU0 is set to level H. Thus, the potential on the plate line PLU0 is applied to the bit lines BLU0 and BLU1 via the ferroelectric capacitors CU0 and CU1 and the transistors TU0 and TU1. As a result, the read potential (V0 or V1) is generated on the bit lines BLU0 and BLU1. As is described above, since the bit lines BLU0, BLL0, BLU1 and BLL1 are connected to the global bit lines GBL0 and GBL1, the parasitic capacitances of the global bit lines GBL0 and GBL1 are satisfactorily large, and accordingly, reading margin ΔV=V1−V0 also becomes satisfactorily large.

At time t4, the switching control line SWL in the second block 320 is set to level L. Then, since the switch transistors SWLT0 and SWLT1 are rendered off, the bit lines BLL0 and BLL1 are disconnected from the global bit lines GBL0 and GBL1. Therefore, the parasitic capacitances on the global bit lines GBL0 and GBL1 are about a half those when the switch transistors SWLT0 and SWLT1 are on.

At time t5, the signal SAE is set to level H, and the sense amplifier SA is activated. As a result, the potential difference between the global bit lines GBL0 and GBL1 is amplified. In this embodiment, since at amplification time the parasitic capacitances of the global bit lines GBL0 and GBL1 are small, only a small current is supplied by the sense amplifier SA to the global bit lines GBL0 and GBL1, and accordingly, the consumption of power by the sense amplifier SA is low.

At time t6, the bit line selection signal line SEL is set to level H. Then, the transistors SET0 and SET1 are rendered on and the potentials on the global bit lines GBL0 and GBL1 are output to the data bus 330.

At time t7, the potential on the plate line PLU0 is returned to level L.

At time t8, the potential on the precharge control line PCHG is returned to level H, and the potential on the signal SAE is set to level L. As a result, to ground the global bit lines GBL0 and GBL1 the transistors PCT0 and PCT1 are rendered on and the sense amplifier SA does not output read data. Also at time t8, the switching control line SWL is returned to level H. Since the switch transistors SWLT0 and SWLT1 are rendered on, the bit lines BLL0 and BLL1 are connected to the global bit lines GBL0 and GBL1.

At time t9, the potentials on the word lines WLU0 and WLU1 are set to level L, the transistors TU0 and TU1 are rendered off, and the reading operation is terminated.

The operation for reading data from the memory cells MU2, MU3, . . . in the first block 310 is performed substantially the same as is the reading operation for the memory cell MU1.

In order to read data from the memory cells ML0, ML1, . . . of the second block 320, the global bit lines GBL0 and GBL1 are charged (see t3 in FIG. 4) and the switch transistors SWUT0 and SWUT1 are rendered off (see t4 in FIG. 4). That is, upon the amplification of read data, the bit lines BLU0 and BLU1 of the first block 310 are disconnected from the global bit lines GBL0 and GBL1.

As is described above, since the sense amplifier is used in common for the FeRAM of the embodiment, the size of the area required for the entire integrated circuit can be reduced compared with the size of the are required by the first embodiment.

As is described above, in the embodiment, the same number of memory cells are employed for the first block 310 and the second block 320. However, the same number of memory cells is not necessarily provided for both of the blocks 310 and 320. When less frequently read data is stored in a block having a greater number of memory cells, and frequently read data is stored in a block having a smaller number of memory cells, power consumption can be reduced even more.

Third Embodiment

A 2-transistor 2-capacitor/1-bit type FeRAM will now be explained as a semiconductor device according to a third embodiment of the present invention.

This embodiment differs from the first embodiment in that a memory cell array for one column is divided into three or more blocks.

Figure 5:
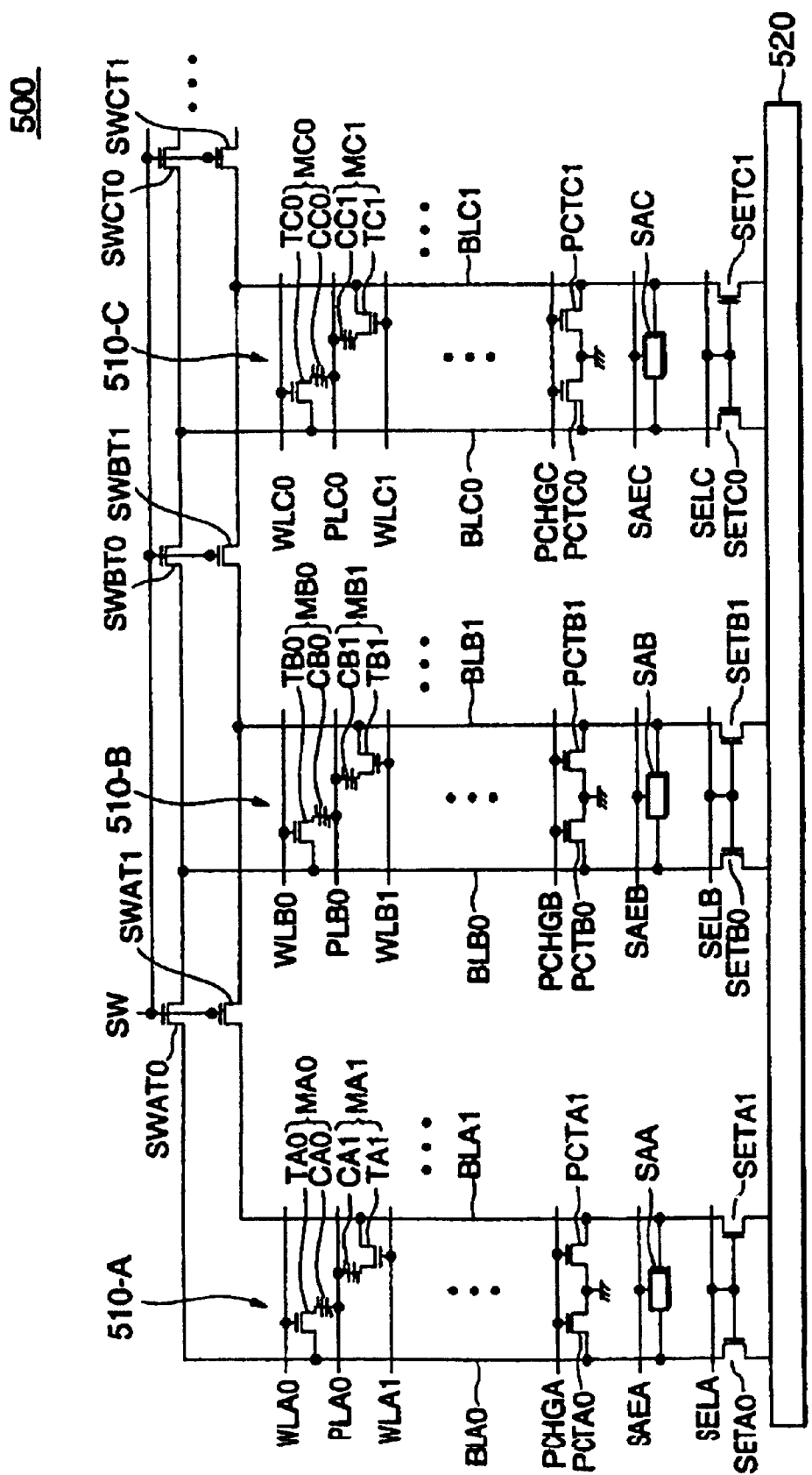
FIG. 5 is a diagram showing the configuration of a ferroelectric memory device according to a third embodiment of the present invention.

FIG. 5 is a circuit diagram showing the structure of one column of a memory cell array for the FeRAM according to this embodiment.

As is shown in FIG. 5, each column of a memory cell array for an FeRAM 500 includes a plurality of (at least three) blocks 510-A, 510-B, 510-C, . . . . The first block 510-A includes memory cells MA0, MA1, . . . , precharge transistors PCTA0 and PCTA1, a sense amplifier SAA, bit line selection transistors SETA0 and SETA1, and bit lines (line segments) BLA0 and BLA1. In addition, word lines WLA0, WLA1, . . . , plate lines PLA0 and PLA1, a precharge control line PCHGA, an activated signal line SAEA and a selection line SELA are provided as common control lines for each column.

The second block 510-B includes memory cells MB0, MB1, . . . , precharge transistors PCTB0 and PCTB1, a sense amplifier SAB, bit line selection transistors SETB0 and SETB1, and bit lines (line segments) BLB0 and BLB1. Further, word lines WLB0, WLB1, . . . , plate lines PLB0 and PLB1, a precharge control line PCHGB, an activated signal line SAEB and a selection line SELB are provided as common control lines for each column.

The third block 510-C includes memory cells MC0, MC1, . . . , precharge transistors PCTC0 and PCTC1, a sense amplifier SAC, bit line selection transistors SETC0 and SETC1, and bit lines (line segments) BLC0 and BLC1. Further, word lines WLC0, WLC1, . . . , plate lines PLC0 and PLC1, a precharge control line PCHGC, an activated signal line SAEC and a selection line SELC are provided as common control lines for each column.

The structure of the first to third blocks is also employed for the fourth and following blocks.

The bit lines BLAD and BLA1 in the first block 510-A are connected to the bit lines BLB0 and BLB1 in the second block 510-B via switch transistors SWAT0 and SWAT1. The bit lines BLB0 and BLB1 in the second block 510-B are connected to the bit lines BLC0 and BLC1 in the third block 510-C via switch transistors SWBT0 and SWBT1. Further, the bit lines BLB0 and BLB1 in the third block 510-B are connected to the bit lines (not shown) in the fourth block via switch transistors SWCT0 and SWCT1. The gates of the switch transistors are connected to the switching control line SW.

In this embodiment, the same number of memory cells are provided for the blocks 510-A, 510-B and 510-C. Thus, the capacitances on the individual bit lines are equalized.

The word lines WLA0, WLA1, . . . and the plate lines PLA0, PLA1, . . . in the first block 510-A are arranged in parallel in the row direction of the memory cell array. The word lines WLA0, WLA1, . . . are paired and arranged so that one plate line is positioned between the two word lines. The word lines and the plate lines for the other blocks 510-B, 510-C, . . . are arranged in the same manner.

The bit lines BLA0 and BLA1 in the first block 510-A are paired and arranged in parallel in the columnar direction of the memory cell array, and the bit lines in the other blocks 510-B and 510-C are arranged in the same manner. The capacitance on each bit line is determined by the junction capacitance or the wiring capacitance of the transistor. In this embodiment, the parasitic capacitance on each bit line is set so that the sum of the bit lines in the same row (e.g., BLA0, BLB0, BLC0, . . . ) is a value that is large enough to obtain a satisfactory reading margin $\Delta V$ (see FIG. 21).

The memory cells MA0, MA1, . . . in the first block 510-A are arranged at locations whereat the word lines WLA0, WLA1, . . . intersect the bit lines BLA0 and BLA1. The memory cells MA0, MA1, . . . respectively include MOS transistors TA0, TA1, . . . and ferroelectric capacitors CA0, CA1, . . . . For the MOS transistors TA0, TA1, . . . , gates are connected to corresponding word lines, drains are connected to corresponding bit lines, and sources on one side are connected to the ends of corresponding ferroelectric capacitors CA0, CA1, . . . . The other ends of the ferroelectric capacitor CA0, CA1, . . . are connected to a corresponding plate line. The memory cells in the other blocks 510-B, 510-C, . . . are arranged in the same manner.

The precharge control line PCHGA, the selection signal line SELA and the activated signal line SAEA in the first block 510-A are arranged so that they are perpendicular to the bit lines BLA0 and BLA1. The precharge control lines, the selection signal lines and the activated signal lines in the other blocks 510-B, 510-C, . . . are arranged in a like manner.

For the precharge transistors PCTA0 and PCTA1 in the first block 510-A, gates are connected to the precharge control line PCHGA, sources are connected to corresponding bit lines, and drains are grounded. The same connection arrangement is used for precharge transistors in the other blocks 510-B, 510-C, . . . .

For the bit line selection transistors SETA0 and SETA1 in the first block 510-A, gates are connected to the selection line SELA, sources are connected to corresponding bit lines, and drains are connected to a data bus 520. The same connection arrangement is used for the bit line selection transistors in the other blocks 510-B, 510-C, . . . .

The sense amplifier SAA in the first block 510-A is activated when the level of the signal SAEA is high, and amplifies the potential difference between the bit lines BLA0 and BLA1. The same process is performed in the other blocks 510-B, 510-C, . . . by the sense amplifiers. In this embodiment, when data is read from the memory cells MA0, MA1, . . . in the first block 510-A, the sense amplifier SAA in the first block 510-A amplifies the potential difference. For the other blocks 510-B, 510-C, . . . , the sense amplifiers belonging to the same blocks as the pertinent bit lines also perform amplification processes. In this embodiment, since no limitation is placed on the types of sense amplifiers SAA, SAB, SAC, . . . that can be used, a detailed explanation will not be given for the internal structure.

For the switch transistors SWAT0, SWTA1, SWBT0, SWBT1, SWCT0, SWCT1, . . . , gates are connected to the switching control line SW, and sources and drains are connected to corresponding bit lines.

Figure 6:
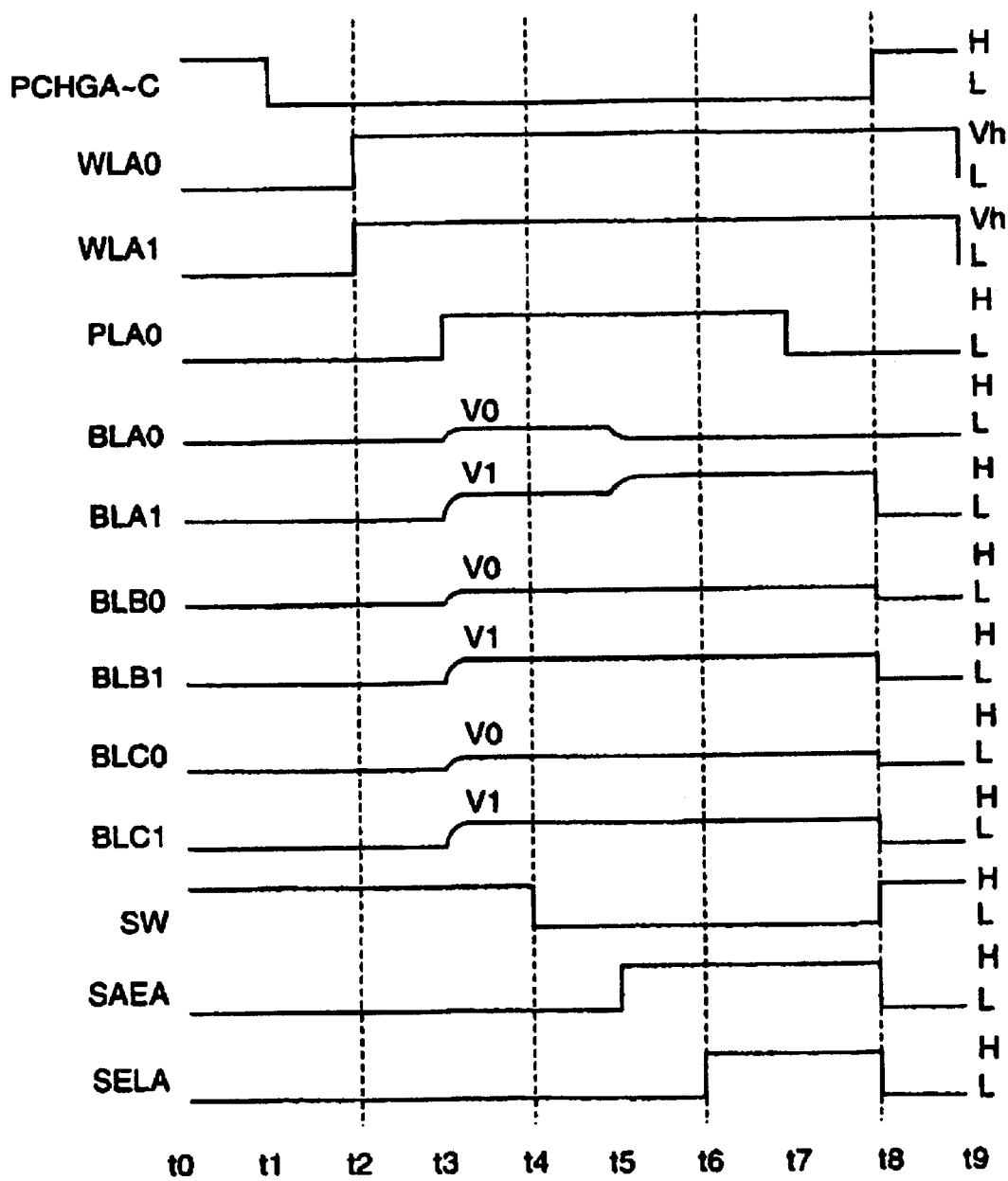
FIG. 6 is a timing chart for explaining the operation of the ferroelectric memory device according to the third embodiment of the present invention.

The reading operation performed by the FeRAM 500 in FIG. 5 will now be described by using the timing chart in FIG. 6. In this embodiment, an explanation will be given for a case wherein data is read from the memory cells MA0 and MA1. In FIG. 6, L denotes a ground potential and H denotes a power voltage Vcc, and Vh denotes a potential that is higher than the power voltage Vcc by an amount that corresponds to the threshold value Vt for the transistors TA0 and TA1 in the memory cell.

In the initial state (time t0), the potential on the switching control line SW is at level H. Since the switch transistors SWAT0, SWAT1, SWBT0, SWBT1, SWCT0, SWCT1, . . . are on, the bit lines BLA0, BLB0, BLC0, . . . are connected together, as are the bit lines BLA1, BLB1, BLC1 . . . .

In order to read data from the memory cells MA0 and MA1, first, at time t1 the potentials on the precharge control lines PCHGA, PCHGB, PCHGC, . . . are set to level L. Thus, since the transistors PCTA0, PCTB0, PCTC0, . . . are rendered off, the bit lines BLA0, BLB0 and 2LC0 are set to the floating state. Further, since the transistors PCTA1, PCTB1, PCTC1, . . . are rendered off, the bit lines BLA1, BLB1 and BLC1 are set to the floating state.

At time t2, the word lines WLA0 and WLA1 are set to level Vh. Thus, the transistors TA0 and TA1 in the memory cells MA0 and MA1 are rendered on, and on one side the ends of the ferroelectric capacitors CA0 and CA1 are connected to the bit lines BLA0 and BLA1. The word lines WLA0 and WLA1 are set to level Vh rather than to level H because the output voltages (drain voltages) of the transistors TA0 and TA1 are lower than the input voltages (source voltages) by an amount corresponding to Vt.

Sequentially, at time t3, the plate line PLA0 is set to level H. Thus, the potential on the plate line PLA0 is applied to the bit lines BLA0 and BLA1 via the ferroelectric capacitors CA0 and CA1 and the transistors TA0 and TA1, and as a result, a read potential (V0 or V1) is generated on the bit lines BLA1 and BLA2. As is described above, since the switch transistors SWAT0, SWBT0, SWCT0, . . . are on, the bit line BLA0 is connected to the bit lines BLB0, BLB1, . . . , so that the parasitic capacitance on the bit line BLA0 is satisfactorily large. Similarly, since the switch transistors SWAT1, SWBT1, SWCT1, . . . are on, the bit line BLA1 is connected to the bit lines BLB1, BLC1, . . . and the parasitic capacitance on the bit line BLA1 is satisfactorily large. Likewise, the reading margin $\Delta V=V1-V0$ becomes satisfactorily large.

At time t4, the switching control line SW is set to level L. Then, since the switch transistors SWAT0, SWBT0, . . . and the switch transistors SWAT1, SWBT1, . . . are rendered off, the bit lines BLA0 and BLA1 are disconnected from the other bit lines and the parasitic capacitances on the bit lines BLA0 and BLA1 are reduced compared with when the switch transistors SWAT0 and SWAT1 are on. When, for example, each column in a memory cell array is divided into three blocks, 510-A, 510-B and 510-C, the parasitic capacitance is reduced to one third by rendering off the switch transistors SWAT0 and SWAT1.

At time t5, the signal SAEA is set to level H, and the sense amplifier SAA is activated. As a result, the potential difference between the bit lines BLA0 and BLA1 is amplified. In this embodiment, since the parasitic capacitances on the bit lines BLA0 and BLA1 are small at the time of amplification, only a small current is supplied by the sense amplifier SAA to the bit lines BLA0 and BLA1, and accordingly, the power consumption of the sense amplifier SAA is low.

At time t6, the bit line selection signal line SELA is set to level H. Then, the transistors SETA0 and SETA1 are rendered on and the potentials on the bit lines BLA0 and BLA1 are output to the data bus 520.

At time t7, the potential on the plate line PLA0 is returned to level L.

At time t8, the potentials on the precharge control lines PCHGA, PCHGB, PCHGC, . . . are returned to level H, and the potential of the signal SAEA is set to level L. As a result, to ground the bit lines BLA0, BLA1, BLB0 and BLB1 the transistors PCTA0, PCTA1, PCTB0, PCTB1, . . . are rendered on, and the sense amplifier SAA halts the output of read data. Also, at time t8 the switching control line SW is returned to level H. Since the switch transistors SWAT0, SWAT1, SWBT0, SWBT1, . . . are rendered on, the bit lines BLA0, BLB0, BLC0, . . . are connected together, as are the bit lines BLA1, BLB1, BLC1, . . . .

At time t9, the potentials on the word lines WLA0 and WLA1 are set to level L, the transistors TA0 and TA1 are rendered off, and the reading operation is terminated.

The operation for reading data from the other memory cells MA2, MA3, . . . in the first block 510-A is performed substantially the same as the reading operation for the memory cell MA1.

The same reading operation as is used for the memory cell MA1 is also employed to read data from the memory cells of the other blocks 510-B, 510-C, . . . , with the exception that different sense amplifiers and bit line selection transistors are employed.

As is described above, for the FeRAM 500 in this embodiment, for the same reasons as in the first embodiment, a satisfactory large reading margin $\Delta V$ can be obtained while in the data amplification process the capacitance can be reduced. As a result, the yield can be improved and power consumption can be reduced.

The third embodiment is especially effective when an FeRAM is formed on an SOI (Silicon On Insulator) substrate. Generally, the junction capacitance of a transistor formed on an SOI substance is equal to or smaller than one tenth of the junction capacitance of a transistor formed on a silicon substrate. Therefore, in order to obtain the optimal capacitance for an FeRAM that is manufactured using an SOI substrate, ten times the number of transistors required when a silicon substrate is employed must be connected to the bit lines. Assuming that 256 transistors is the optimal number that is connected to the bit lines for a silicon substrate, 2560 transistors are required for an SOI substrate. Therefore, for an FeRAM that uses the SOI substrate, a very extended bit line is required. Thus, even when the number of switch transistors is increased due to an increase in the segments into which each column of a memory cell array is divided, this increase affects the entire length of a bit line less, and accordingly, the effect of a disadvantage, such as an increase in the circuit size, can be reduced. Further, when the number of segments into which the column is divided is increased, the power consumption of the sense amplifier can be reduced compared with those of the first and second embodiments.

As is described above, according to the third embodiment, the same number of memory cells is employed for the blocks 510-A, 510-B, 510-C, . . . . However, the same number of memory cells is not necessarily included in the arrangements used for all the blocks. And likewise, when less frequently read data is stored in a block having more memory cells, the power consumption can be even further reduced.

Fourth Embodiment

A 2-transistor 2-capacitor/1-bit type FeRAM will now be explained as a semiconductor device according to a fourth embodiment of the present invention.

This embodiment differs from the second embodiment in that a memory cell array for one column is divided into three or more blocks.

Figure 7:
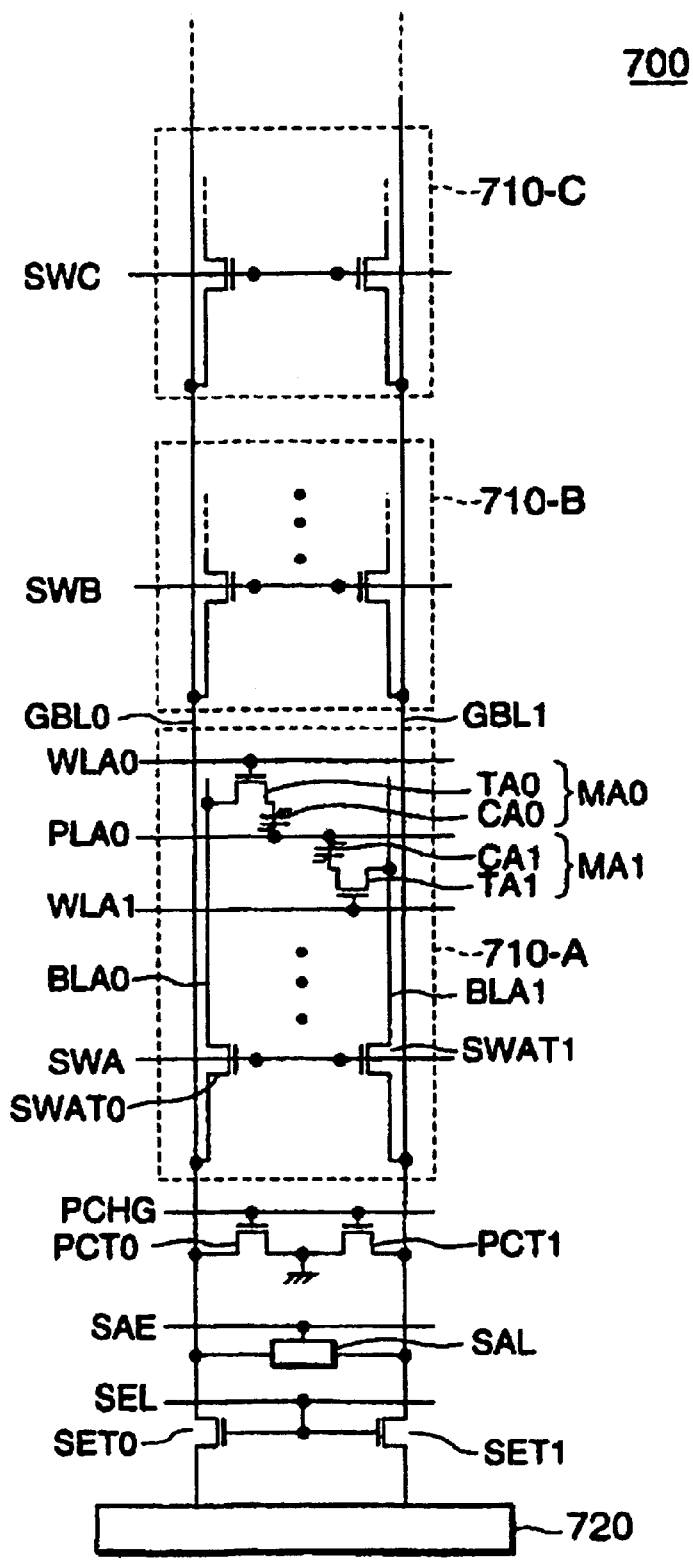
FIG. 7 is a diagram showing the configuration of a ferroelectric memory device according to a fourth embodiment of the present invention.

FIG. 7 is a circuit diagram showing the structure of one column of a memory cell array of the FeRAM according to this embodiment.

As is shown in FIG. 7, one column of a memory cell array for an FeRAM 700 includes three or more memory cell blocks 710-A, 710-B, 710-C, . . . , precharge transistors PCT0 and PCT1, a sense amplifier SA, bit line selection transistors SET0 and SET1 and global bit lines GBL0 and GBL1. The first block 710-A includes memory cells MA0, MA1, . . . , switch transistors SWAT0 and SWAT1 and bit lines (support lines) BLA0 and BLA1. Word lines WLA0, WLA1, . . . , plate lines PLA0, PLA1, . . . and switching control lines SWA are provided as common control lines for the first block 710-A in each column. The same arrangement is provided for the second and following blocks. Further, a precharge control line PCHG, an activated signal line SAE and a selection line SEL are provided as common control lines for precharge transistors PCT0 and PCT1, a sense amplifier SA and bit line selection transistors SET0 and SET1 in each column.

In this embodiment, the same number of memory cells are employed for the blocks 710-A, 710-B, 710-C, . . . . Therefore, the capacitances on the bit lines in these blocks are substantially equalized.

The word lines WLA0, WLA1, . . . and the plate lines PLA0, PLA1, . . . in the first block 710-A are arranged in parallel in the row direction of the memory cell array. The word lines WLA0, WLA1, . . . are paired and arranged so that one plate line is positioned between the two word lines. The word lines and the plate lines in the other blocks 710-B, 710-C, . . . have the same arrangement.

The bit lines BLA0 and BLA1 in the first block 710-A are paired and arranged in parallel in the columnar direction of the memory cell array, and the bit lines in the other blocks 710-B, 710-C, . . . are arranged in the same manner. The parasitic capacitance on each bit line is determined by the junction capacitance or the wiring capacitance of the transistor, and in this embodiment, the parasitic capacitance of the bit line is set so that the sum of the capacitances of the bit lines in the same row is an appropriate value for obtaining a satisfactory reading margin $\Delta V$ (see FIG. 21).

The global bit lines GBL0 and GBL1 are connected via the switch transistors SWAT0 and SWAT1 to the bit lines BLA0 and BLA1 in the first block 710-A, and the gates of the switch transistors SWAT0 and SWAT1 are connected to the switching control line SWA. The same connection arrangement is provided for the other blocks 720-B, 720-C, . . . .

The memory cells MA0, MA1, . . . in the first block 710-A are arranged at the locations whereat the word lines WLA0, WLA1, . . . intersect the bit lines BLA0 and BLA1. The memory cells MA0, MA1, . . . respectively include MOS transistors TA0, TA1, . . . and ferroelectric capacitors CA0, CA1, . . . . For the MOS transistors TA0, TA1, . . . , gates are connected to corresponding word lines, drains are connected to corresponding bit lines, and sources are connected on one side to the ends of corresponding ferroelectric capacitors CA0, CA1, . . . . The other ends of the ferroelectric capacitors CA0, CA1, . . . are connected to a corresponding plate line. The same connection arrangement is provided for the memory cells in the other blocks 710-B, 710-C, . . . .

For the precharge transistors PCT0 and PCT1, gates are connected to the precharge control line PCHG, sources are connected to corresponding bit lines, and drains are grounded.

For the bit line selection transistors SET0 and SET1, gates are connected to the selection line SEL, sources are connected to corresponding bit lines, and drains are connected to a data bus 720.

The sense amplifier SA is activated when the level of the signal SAE is high, and amplifies the potentials on the bit lines GBL0 and GBL1 and outputs the results. In this embodiment, since no limitation is placed on the type of sense amplifier SA that can be used, a detailed explanation will not be given for the internal structure.

Figure 8:
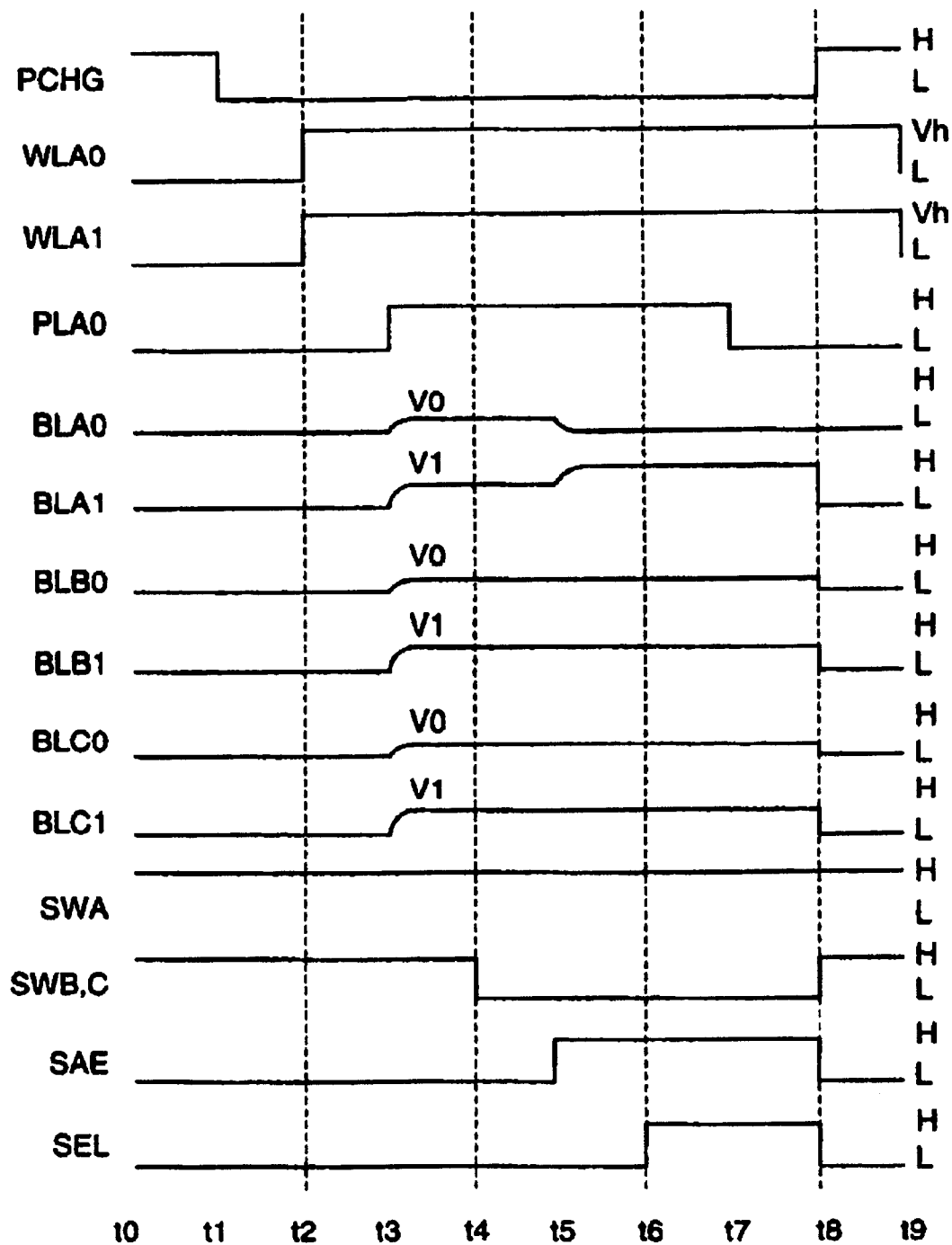
FIG. 8 is a timing chart for explaining the operation of the ferroelectric memory device according to the fourth embodiment of the present invention.

The reading operation performed by the FeRAM 700 in FIG. 7 will now be described by using the timing chart in FIG. 8. In this embodiment, an explanation will be given for a case wherein data is read from the memory cells MA0 and MA1. In FIG. 8, L denotes a ground potential and H denotes a power voltage Vcc. Vh denotes a potential that is higher than the power voltage Vcc by an amount that correspond to the threshold value Vt for the transistors TA0 and TA1 in the memory cell.

In the initial state (time t0), the potentials on the switching control lines SWA, SWB, SWC, . . . are at level H. Since the switch transistors SWAT0, SWBT0, SWCT-0, . . . and SWAT1, SWBT1, SWCT1, . . . are on, the bit lines BLA0, BLB0, BLC0, . . . are connected to the global bit line GBL0, and the bit lines BLA1, BLB1, BLC1, . . . are connected to the global bit line GBLS1.

In order to read data from the memory cells MA0 and MA1, first, at time t1 the potential on the precharge control line PCHG is set to level L. Thus, since the transistors PCT0 and PCT1 are rendered off, the global bit lines GBL0 and GBL1 are set to the floating state.

At time t2, the word lines WLA0 and WLA1 are set to level Vh. Thus, the transistors TA0 and TA1 in the memory cells MA0 and MA1 are rendered on, and the ends of the ferroelectric capacitors CA0 and CA1 on one side are connected to the bit lines BLA0 and BLA1. The word lines WLA0 and WLA1 are set to level Vh rather than to level H, because the output voltages (drain voltages) for the transistors TA0 and TA1 are lower than the input voltages (source voltages) by an amount corresponding to Vt.

Sequentially, at time t3, the plate line PLA0 is set to level H. Thus, the potential on the plate line PLA0 is applied to the bit lines BLA0 and BLA1 via the ferroelectric capacitors CA0 and CA1 and the transistors TA0 and TA1. As a result, the read potential (V0 or V1) is generated at the bit lines BLA0 and BLA1. As is described above, since the bit lines in the blocks 710-A, 710-B, 710-C, . . . are connected to the global bit lines, the parasitic capacitances on the global bit lines GBL0 and GBL1 are satisfactorily large. Accordingly, reading margin $\Delta V = V1 - V0$ becomes satisfactorily large.

At time t4, the switching control lines SWB, SWC, . . . in the second and following blocks 710-B, 710-C, . . . are set to level L. Then, the bit lines in the blocks 710-A, 710-B, 710-C, . . . are disconnected from the global bit lines GBL0 and GBL1. Therefore, the parasitic capacitances on the global bit lines GBL0 and GBL1 are reduced.

At time t5, the signal SAE is set to level H, and the sense amplifier SA is activated. As a result, the potential difference between the global bit lines GBL0 and GBL1 is amplified. In this embodiment, since the parasitic capacitances on the global bit lines GBL0 and GBL1 are small at the amplification time, only a small current is supplied by the sense amplifier SA to the global bit lines GBL0 and GBL1, and accordingly, the power consumption of the sense amplifier SA is low.

At time t6, the bit line selection signal line SEL is set to level H. Then, the transistors SET0 and SET1 are rendered on, and the potentials on the global bit lines GBL0 and GBL1 are output to the data bus 720.

At time t7, the potential on the plate line PLA0 is returned to level L.

At time t8, the potential on the precharge control line PCHG is returned to level H, and the potential of the signal SAE is set to level L. As a result, to ground the global bit lines GBL0 and GBL1 the transistors PCT0 and PCT1 are rendered on and the sense amplifier SA does not output read data. Also, at time t8 the switching control lines SWB, SWC, . . . are returned to level H. And since the switch transistors SWBT0, SWCT0, . . . and the switch transistors SWBT1, SWCT1, . . . are rendered on, the bit lines BLA0 and BLA1 are connected to the global bit lines GBL0 and GBL1.

At time t9, the potentials on the word lines WLA0 and WLA1 are set to level L, the transistors TA0 and TA1 are rendered off, and the reading operation is terminated.

The operation for reading data from the memory cells MA2, MA3, . . . in the first block 710-A is performed substantially in the same manner as is the reading operation for the memory cell MA1.

The reading operation performed for the memory cell MA1 is also performed to read data from the memory cells in the other blocks 710-B, 710-C, . . . , with the exception that the bit line selection transistors differ.

As is described above, for the FeRAM 700 in this embodiment, for the same reasons as in the first embodiment, a satisfactorily large reading margin $\Delta V$ can be obtained while during the data amplification process the capacitance can be reduced. As a result, the yield can be improved and the power consumed can be reduced.

For the same reasons as in the third embodiment, this embodiment is especially effective when an FeRAM is formed on an SOI substrate.

As is described above, in the embodiment, the same number of memory cells are employed for the blocks 710-A, 710-B, 710-C, . . . . However, the same number of memory cells is necessarily used for these blocks, and when less frequently read data are stored in a block having a greater number of memory cells, power consumption can be reduced even more.

Fifth Embodiment

An explanation will now be given for a semiconductor device according to a fifth embodiment of the present invention. In this embodiment, the FeRAM 100 for the first embodiment (see FIG. 1) is modified to provide a 1-transistor 1-capacitor/1-bit type FeRAM.

Figure 9:
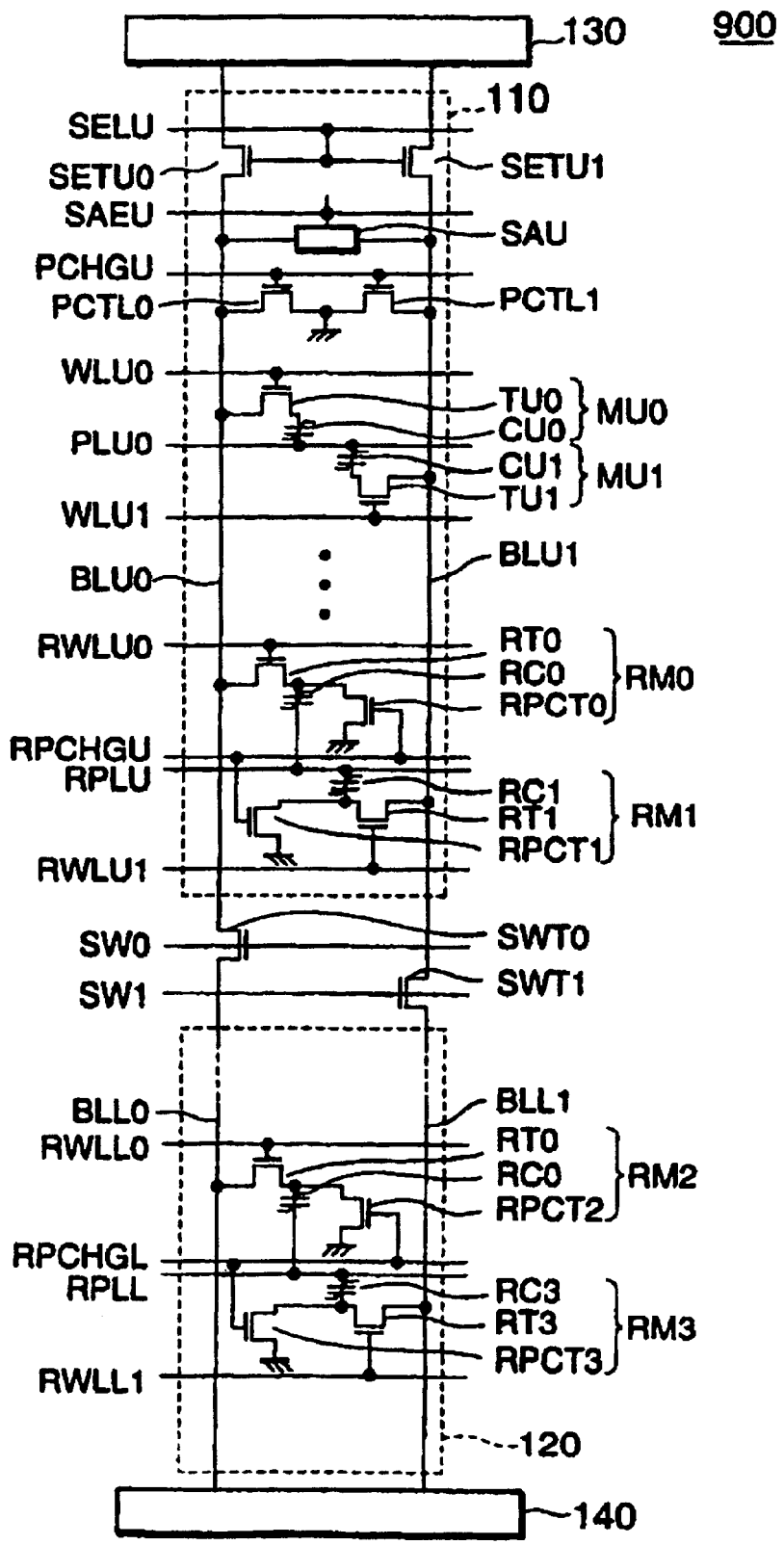
FIG. 9 is a diagram showing the configuration of a ferroelectric memory device according to a fifth embodiment of the present invention.

FIG. 9 is a circuit diagram for one column of a memory cell array for the FeRAM according to the embodiment. In FIG. 9, the same reference numerals as are used in FIG. 1 are used to denote corresponding components. And while for simplification a part of the configuration in a block 120 is not shown in FIG. 9, the configuration shown in FIG. 9 is substantially the same as the one shown in FIG. 1, with the exception of an additional portion that will be described below.

As is shown in FIG. 9, the memory cell array of an FeRAM 900 includes two switching control lines SW0 and SW1. The switching control line SW0 is connected to the gate of the switch transistor SWT0 of each column, and the switching control line SW1 is connected to the gate of the switch transistor SWT1.

The memory cell array for the FeRAM 900 includes in each column reference memory cells RM0, RM1, RM2 and RM3. Further, the FeRAM 900 includes four reference word lines RWLU0, RWLU1, RWLL0 and RWLL1, two reference plate lines RPLU and RPLL, and two reference precharge lines RPCHGU and RPCHGL, all of which are arranged in the row direction.

The reference memory cell RM0 includes a selection transistor RT0, a ferroelectric capacitor RC0 and a precharge transistor RPCT0. For the selection transistor RT0, the gate is connected to the reference word line RWLU0, and the drain is connected to the bit line BLU0. For the ferroelectric capacitor RC0, one end is connected to the source of the selection transistor RT0, and the other end is connected to the plate line RPLU. For the precharge transistor RPCT0, the gate is connected to the precharge line RPCHGU, the source is connected to the source of the selection transistor RT0, and the drain is grounded.

Similarly, the reference memory cell RM1 includes a selection transistor RT1, a ferroelectric capacitor RC1 and a precharge transistor RPCT1; the reference memory cell RM2 includes a selection transistor RT2, a ferroelectric capacitor RC2 and a precharge transistor RPCT2, and the reference memory cell RM3 includes a selection transistor RT3, a ferroelectric capacitor RC3 and a precharge transistor RPCT3. The transistors and the capacitors of these memory cells RM1, RM2 and RM3 are connected in the same manner as is the memory cell RM0.

Figure 10:
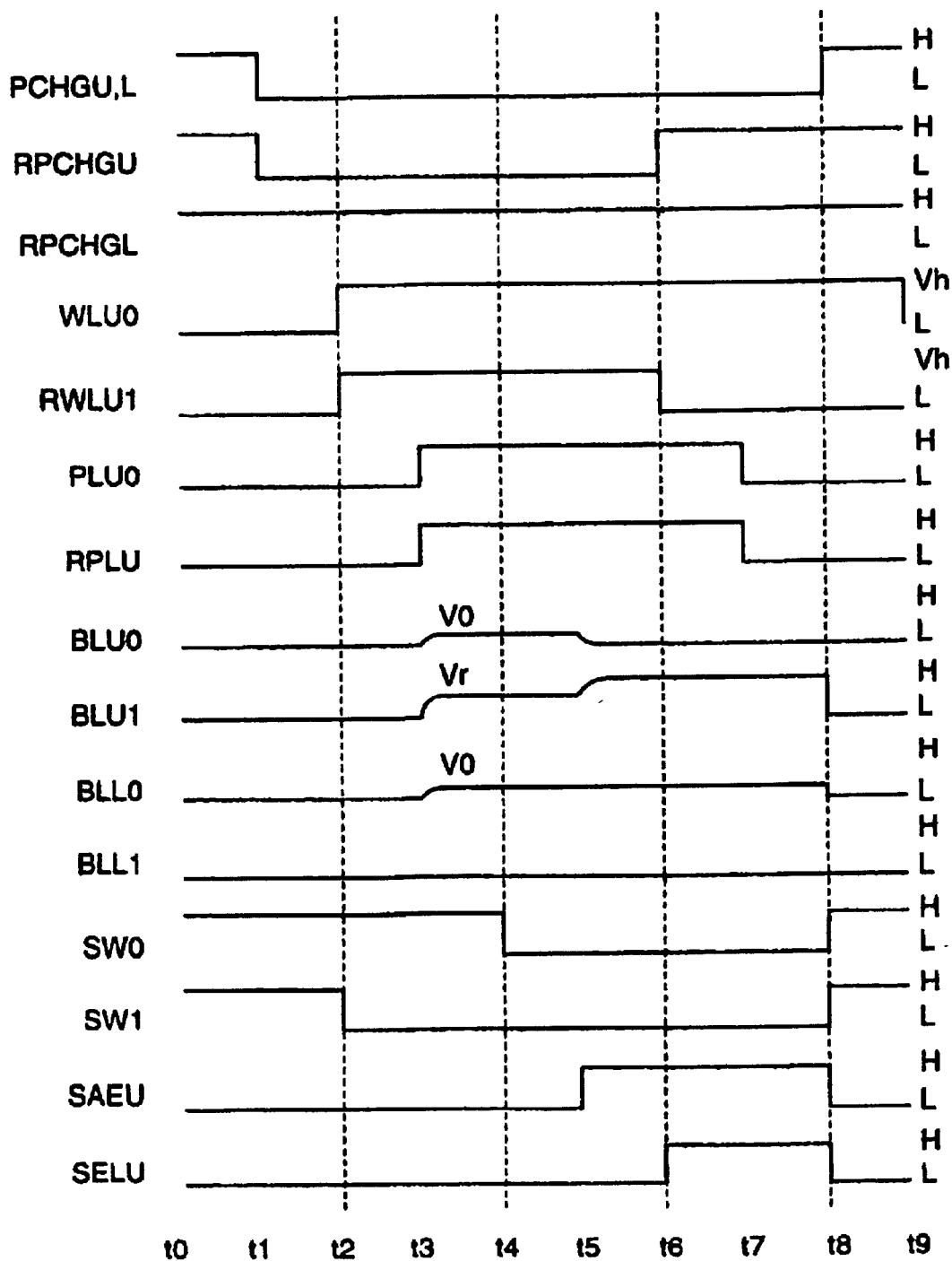
FIG. 10 is a timing chart for explaining the operation of the ferroelectric memory device according to the fifth embodiment of the present invention.

The reading operation performed for the FeRAM 900 in FIG. 9 will now be described by using the timing chart in FIG. 10. In this embodiment, an explanation will be given for a case wherein data is read from the memory cell MU0. In FIG. 10, L denotes a ground potential and H denotes a power voltage Vcc. Vh denotes a potential that is higher than the power voltage Vcc by an amount equal to the threshold value Vt of the transistors TU0 and TU1 of the memory cell.

To read data from the memory cell MU0, RM1 is employed as a reference memory cell.

In the initial state (time t0), the potentials of the switching control lines SW0 and SW1 are at level H. Since the switch transistors SWT0 and SWT1 are on, the bit lines BLU0 and BLL0 are connected, and the bit lines BLU1 and BLL1 are also connected.

In order to read data from the memory cell MU0, first, at time t1 the potentials of the precharge control lines PCHGU and PCHGL are set to level L, so that the bit lines BLU0, BLU1, BLL0 and BLL1 are set to the floating state. In addition, at time t1, the potential on the reference precharge control line RPCHGU is set to level L. Therefore, since the precharge transistor RPCT1 in the reference memory cell RM1 is rendered off, the contact point for the drain of the selection transistor RT1 and the ferroelectric capacitor RC1 is also set to the floating state.

At time t2, the word line WLU0 and the reference word line RWLU1 are set to level Vh. Thus, since the transistors TU0 and TU1 in the memory cell MU0 and the transistor RT1 in the reference memory cell RM1 are rendered on, one end of the ferroelectric capacitor CU0 is connected to the bit line BLU0, while one end of the ferroelectric capacitor RC1 is connected to the bit line BLU1. Further, at time t2, the switching control line SW1 is set to level L, and therefore, the bit line BLU1 is disconnected from the bit line BLL1.

Sequentially, at time t3, the plate line PLU0 and the reference plate line RPLU0 are set to level H. Thus, the potential on the plate line PLU0 is applied to the bit line BLU0 via the ferroelectric capacitor CU0 and the transistor TU0, and the potential on the reference plate RPLU is applied to the bit line BLU1 via the ferroelectric capacitor RC1 and the transistor RT1. As a result, a read potential (V0 or V1) is generated on the bit line BLU0, and the reference potential Vr is generated on the bit line BLU1.

Figure 11:
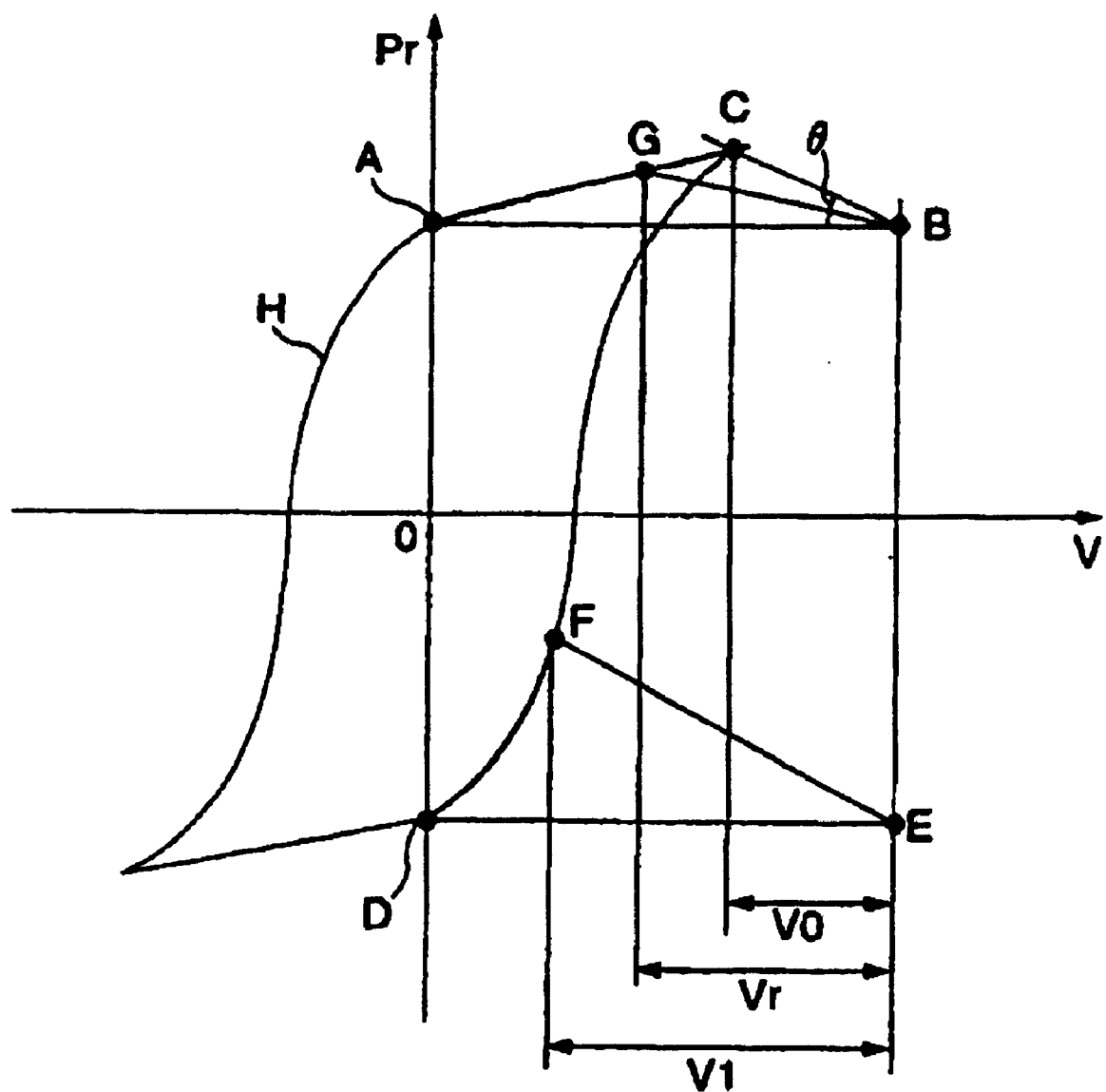
FIG. 11 is a diagram for explaining the state shifting of a capacitor employing a ferroelectric substance.
Figure 21:
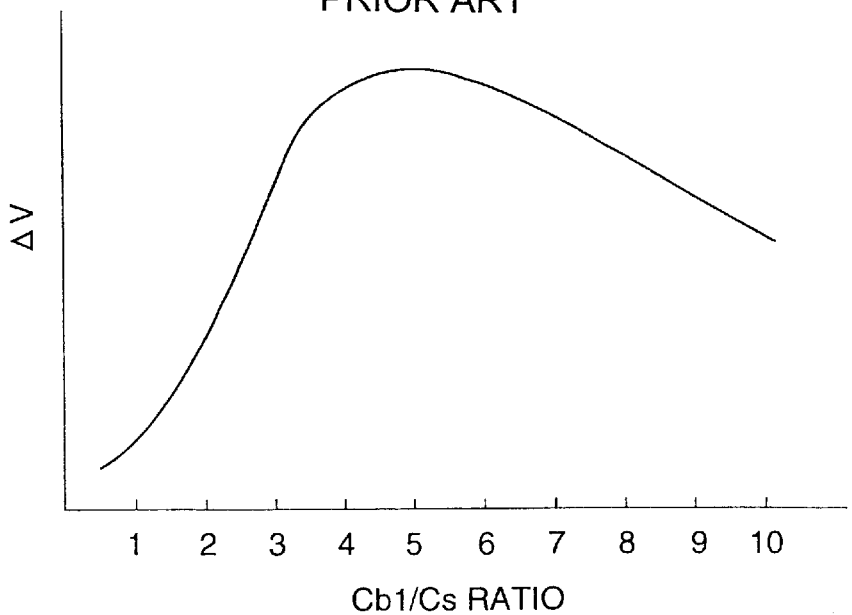
FIG. 21 is a graph for explaining the characteristic of the ferroelectric memory device.

FIG. 11 is a state shifting diagram as is FIG. 21. In FIG. 11, point G corresponds to a case wherein the reference potential Vr is output to the bit line BLU. In this embodiment, the coordinates of the point G are defined as (V3, p4), and the ferroelectric capacitor RC0 is constantly polarized on the "0" side. Therefore, the point G is located on the side Pr>0 along the hysteresis curve H. As is described above, since the bit line BLU1 is disconnected from the bit line BLL1, when the reference potential Vr is output the capacitance is smaller (e.g., one half) than that on the bit line BLU0. Therefore, the reference potential Vr (=Vcc−V3) is always greater than V0 and smaller than V1. Generally, when deterioration of the ferroelectric capacitor occurs, the hysteresis curve H is deformed slightly more on the side Pr>0 than on the side Pr<0. Therefore, the reading potential is better stabilized when the ferroelectric capacitor RC0 is always polarized on the side "0" (i.e., Pr>0).

At time t4, the switching control line SW is set to level L. Then, since the switch transistor SWT0 is rendered off, the bit line BLU0 is disconnected from the bit line BLL0. Therefore, the parasitic capacitance on the bit line BLU0 is half of what it is when the switch transistor SWT0 is on.

At time t5, the signal SAEU is set to level H, and the sense amplifier SAU is activated. As a result, the potential difference between the bit lines BLU0 and BLU1 is amplified. In this embodiment, since the parasitic capacitance on the bit line BLU1 is small at the time amplification occurs, only a small current is supplied by the sense amplifier SAU to the bit line BLU1, and accordingly, the power consumption of the sense amplifier SAU is low.

At time t6, the bit line selection signal line SELU is set to level H. Then, the transistors SETU0 and SETU1 are rendered on, and the potentials on the bit lines BLU0 and BLU1 are output to the data bus 130. Also, at time t6 the reference word line RWLU1 is set to level L, and the reference precharge line RPCHGU is set to H. As a result, the value stored in the reference memory cell RM0 is a constant 0.

At time t7, the potentials on the plate line PLU0 and the reference plate line RPLU are returned to level L.

At time t8, the potentials on the precharge control lines PCHGU and PCHGL are returned to level H, and the potentials of the signals SAEU and SELU are set to level L. As a result, the bit lines PLU0, PLU1, BLL0 and BLL1 are grounded, and the sense amplifier SAU halts the output of read data. Also, at time t8, the switching control lines SW0 and SW1 are returned to level H, and since the switch transistors SWT0 and SWT1 are rendered on, the bit lines BLU0 and BLL0 are connected together, as are the bit lines BLU1 and BLL1.

At time t9, the potential on the word line WLU0 is set to level L, the transistors TU0 and TU1 are rendered off, and the reading operation is terminated.

The operation for reading data from the other memory cells MU1, MU2, MU3, . . . and ML0, ML1, ML2, . . . is performed substantially in the same manner.

As is described above, according to the embodiment, a 1-transistor 1-capacitor/1-bit type FeRAM can be provided with which a satisfactorily large reading margin ΔV is obtained and for which the power consumed by the sense amplifier is low.

In addition, in this embodiment, since the value stored in the reference memory cell is 0, deterioration of the FeRAM does not easily occur.

Sixth Embodiment

An explanation will now be given for a semiconductor device according to a sixth embodiment of the present invention. In this embodiment, the FeRAM 300 for the third embodiment (see FIG. 3) is modified to provide a 1-transistor 1-capacitor/1-bit type FeRAM.

Figure 12:
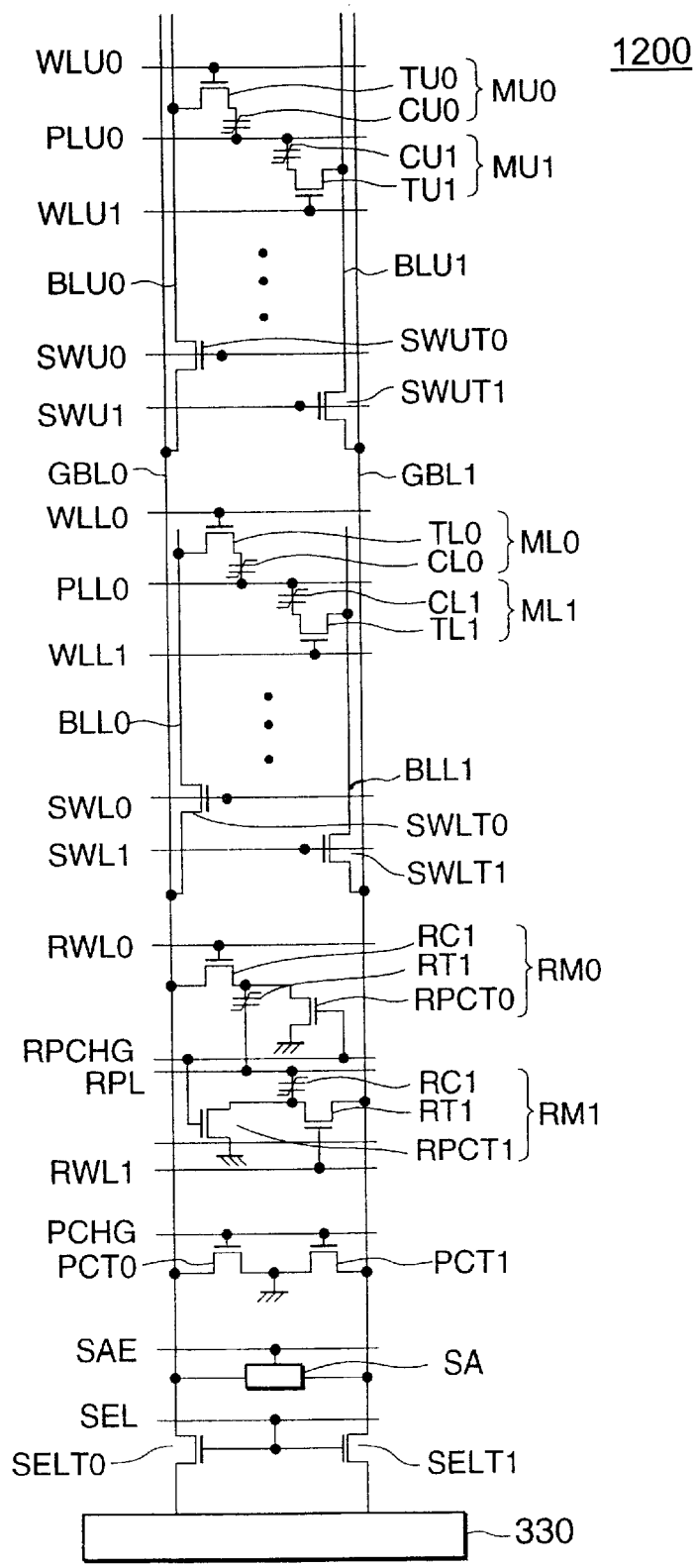
FIG. 12 is a diagram showing the configuration of a ferroelectric memory device according to a sixth embodiment of the present invention.

FIG. 12 is a circuit diagram for one column of a memory cell array for the FeRAM according to the embodiment. In FIG. 12, the same reference numerals as are used in FIG. 3 are used to denote corresponding components.

As is shown in FIG. 12, the memory cell array of an FeRAM 1200 includes switching control lines SWU0 and SWU1 for first block 110, and control switching lines SWL0 and SWL1 for a second block 120. The switching control line SWU0 is connected to the gate of the switch transistor SWUT0 of each column, and the switching control line SWU1 is connected to the gate of the switch transistor SWUT1. Further, The switching control line SWL0 is connected to the gate of the switch transistor SWLT0 of each column, and the switching control line SWU1 is connected to the gate of the switch transistor SWLT1.

The memory cell array for the FeRAM 1200 includes, for each column, reference memory cells RM0 and RM1. Further, the FeRAM 1200 includes two reference word lines RWL0 and RWL1, one reference plate line RPL, and one reference precharge line RPCHG, all of which are arranged in the row direction.

The reference memory cell RM0 includes a selection transistor RT0, a ferroelectric capacitor RC0 and a precharge transistor RPCT0. For the selection transistor RT0, the gate is connected to the reference word line RWLU0, and the drain is connected to the bit line BLU0. For the ferroelectric capacitor RC0, one end is connected to the source of the selection transistor RT0, and the other end is connected to the plate line RPL. For the precharge transistor RPCT0, the gate is connected to the precharge line RPCHG, the source is connected to the source of the selection transistor RT0, and the drain is grounded.

Similarly, the reference memory cell RM1 includes a selection transistor RT1, a ferroelectric capacitor RC1 and a precharge transistor RPCT1. The transistors and capacitors for the memory cell RM1 are connected in the same manner as is the memory cell RM0.

Figure 13:
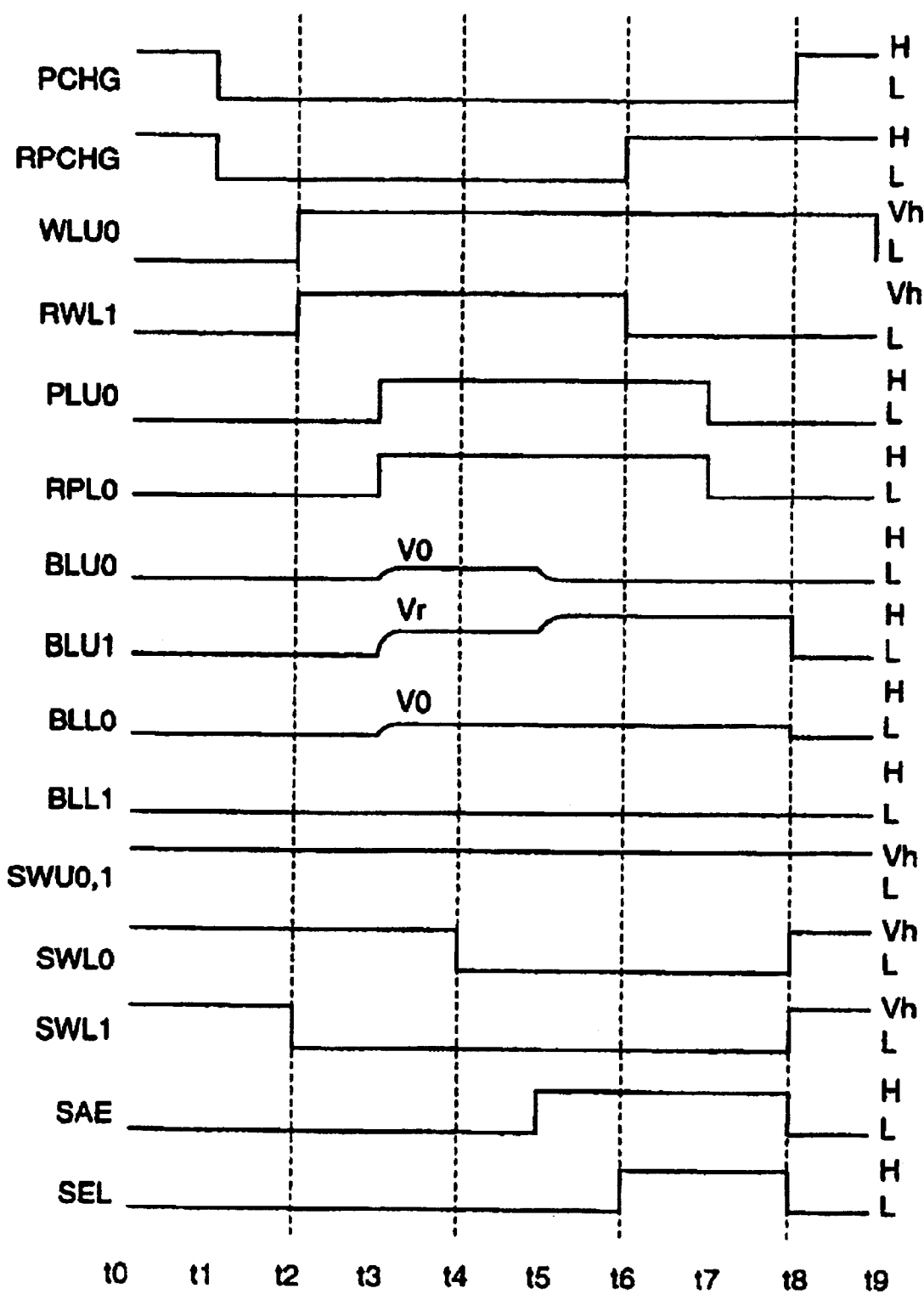
FIG. 13 is a timing chart for explaining the operation of the ferroelectric memory device according to the sixth embodiment of the present invention.

The reading operation performed by the FeRAM 1200 in FIG. 12 will now be described by using the timing chart in FIG. 13. In this embodiment, an explanation will be given for a case wherein the data is read from the memory cell MU0. In FIG. 13, L denotes a ground potential and H denotes a power voltage Vcc. Vh denotes a potential that is higher than the power voltage Vcc by a value that corresponds to the threshold value Vt of the transistors T0 and T1 in the memory cell.

To read data from the memory cell MU0, RM1 is employed as a reference memory cell.

In the initial state (time t0), the potentials on the switching control lines SWU0, SWU1, SWL0 and SWL1 are at level H. Since the switch transistors SWTU0, SWUT1, SWLT0 and SWLT1 are on, the bit lines BLU0 and BLL0 are connected to the global bit line GBL0, and the bit lines BLU1 and BLL1 are connected to the global bit line GBL1.

In order to read data from the memory cell MU0, first, at time t1 the potential on the precharge control line PCHG is set to level L. Thus, since the transistors PCT0 and PCT1 are rendered off, the global bit lines GBL0 and GBL1 are set to the floating state. In addition, at time t1 the potential on the reference precharge control line RPCHG is set to level L. Therefore, since the precharge transistor RPCT1 of the reference memory cell RM1 is rendered off, the contact points of the drains on the selection transistor RT1 and the ferroelectric capacitor RC1 are also set to the floating state.

At time t2, the word line WLU0 and the reference word line RWLU1 are set to level Vh. Thus, since the transistor TU0 of the memory cell MU0 and the transistor RT1 of the reference memory cell RM1 are rendered on, one end of the ferroelectric capacitor CU0 is connected to the bit line BLU0, while one end of the ferroelectric capacitor RC1 is connected to the global bit line GBL1. Further, at time t2 the switching control line SWL1 is set to level L. Therefore, the bit line BLL1 is disconnected from the global bit line GBL1.

Sequentially, at time t3 the plate line PLU0 and the reference plate line RPL are set to level H. Thus, the potential on the plate line PLU0 is applied to the bit line BLU0 (i.e., the global bit line GBL0) via the ferroelectric capacitor CU0 and the transistor TU0, and the potential on the reference plate RPL is applied to the global bit line GBL1 via the ferroelectric capacitor RC1 and the transistor RT1. As a result, a read potential (V0 or V1) is generated on the bit lines BLU0 and BLL0, and the reference potential Vr is generated on the bit line BLU1.

At time t4, the switching control line SWL0 is set to level L. Then, since the switch transistor SWLT0 is rendered off, the bit line BLL0 is disconnected from the global bit line GBL0. Therefore, the parasitic capacitance on the global bit line GBL0 is reduced.

At time t5, the signal SAE is set to level H, and the sense amplifier SA is activated. As a result, the potential difference between the global bit lines GBL0 and GBL1 is amplified. In this embodiment, since the parasitic capacitances on the global bit lines GBL0 and GBL1 are small at the time amplification occurs, only a small current is supplied by the sense amplifier SA to the global bit lines GBL0 and GBL1, and accordingly, the power consumed by the sense amplifier SA is low.

At time t6, the bit line selection signal line SEL is set to level H. Then, the transistors SLT0 and SLT1 are rendered on, and the potentials on the global bit lines GBL0 and GBL1 are output to a data bus 330. Also, at time t6 the reference word line RWL1 is set to level L, and the reference precharge line RPCHG is set to H. As a result, the value stored in the reference memory cell RM0 is a constant 0.

At time t7, the potentials on the plate line PLU0 and the reference plate line RPL are returned to level L.

At time t8, the potential on the precharge control line PCHG is returned to level H, and the potential of the signal SAE is set to level L. As a result, since the transistors PCT0 and PCT1 are rendered on, the global bit lines GBL0 and GBL1 are grounded, and the sense amplifier SA halts the output of read data. Also, at time t8 the switching control lines SWL0 and SWL1 are returned to level H. Since the switch transistors SWLT0 and SWLT1 are rendered on, the bit line BLL0 is connected to the global bit line GBL0, and the bit line BLL1 is connected to the global bit line GBL1.

At time t9, the potential on the word line WLU0 is set to level L, the transistors TU0 and TU1 are rendered off, and the reading operation is terminated.

The operation for the reading of data from the other memory cells MU1, MU2, MU3, . . . and ML0, ML1, ML2, . . . is performed substantially in the same manner.

As is described above, according to the embodiment, a 1-transistor 1-capacitor/1-bit type FeRAM can be provided for which the satisfactorily large reading margin ΔV is obtained and the power consumed by the sense amplifier is low.

In addition, in this embodiment, since the value stored in the reference memory cell is 0, deterioration of the FeRAM is not easily occur.

Seventh Embodiment

An explanation will now be given for a semiconductor device according to a seventh embodiment of the present invention. In this embodiment, the FeRAM 300 for the third embodiment (see FIG. 5) is modified to provide a 1-transistor 1-capacitor/1-bit type FeRAM.

Figure 14:
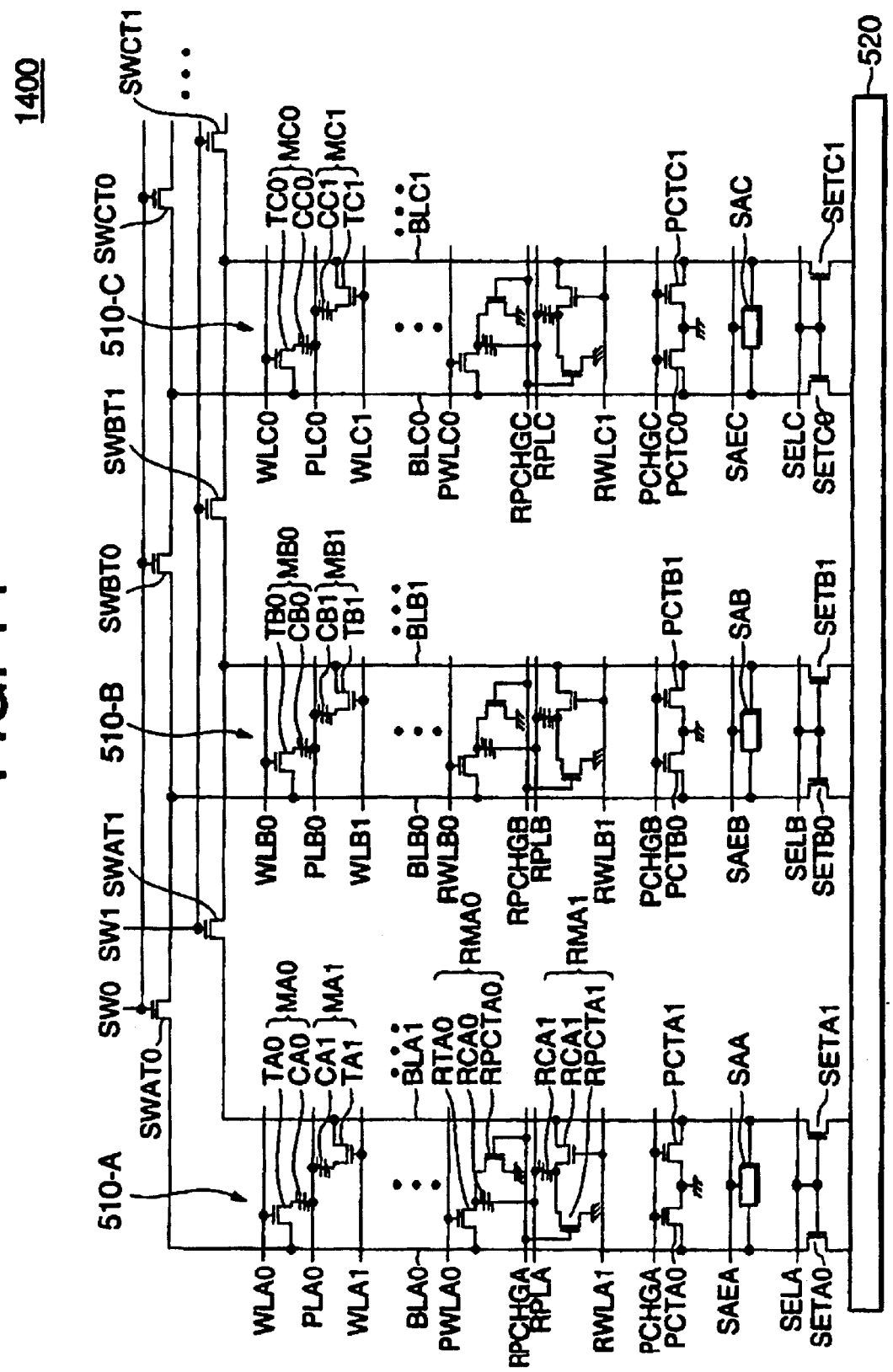
FIG. 14 is a diagram showing the configuration of a ferroelectric memory device according to a seventh embodiment of the present invention.

FIG. 14 is a circuit diagram for one column of a memory cell array for the FeRAM according to the embodiment. In FIG. 14, the same reference numerals as are used in FIG. 3 are used to denote corresponding components.

As is shown in FIG. 14, the memory cell array of an FeRAM 1400 includes two switching control lines SW0 and SW1. The switching control line SW0 is connected to the gates of the switch transistors SWAT0, SWBT0, SWCT0, . . . of each column, and the switching control line SW1 is connected to the gates of the switch transistors SWAT1, SWBT1, SWCT1 . . . .

The blocks 510-A, 510-B, 510-C, . . . of the FeRAM 1400 each include two reference memory cells. For example, the reference memory cells RMA0 and RMA1 are in the block 510-A; the reference memory cells RMB0 and RMB1 are in the block 510-B; and the reference memory cells RMC0 and RMC1 are in the block 510-C. Further, two reference word lines, one reference plate line and one reference precharge line are provided for each block. For example, reference word lines RWLA0 and RWLA1, a reference plate line RPLA and a reference precharge line RPCHGA are provided for the block 510-A. Reference word lines RWLB0 and RWLB1, a reference plate line RPLB and a reference precharge line RPCHGB are provided for the block 510-B. And reference word lines RWLC0 and RWLC1, a reference plate line RPLC and a reference precharge line RPCHGC are provided for the block 510-C.

The reference memory cell RMA0 in the block 510-A includes a selection transistor RTA0, a ferroelectric capacitor RCA0 and a precharge transistor RPCTA0. For the selection transistor RTA0, the gate is connected to the reference word line RWLA0, and the drain is connected to the bit line BLA0. One end of the ferroelectric capacitor RCA0 is connected to the source of the selection transistor RTA0, while the other end is connected to the plate line PRLA. And the gate of the precharge transistor RPCTA0 is connected to the precharge line RPCHGA, the source is connected to the selection transistor RTA0, and the drain is grounded.

Similarly, the reference memory cell RMA1 in the block 510-A includes a selection transistor RTA1, a ferroelectric capacitor RCA1 and a precharge transistor RPCTA1. For the selection transistor RTA1, the gate is connected to the reference word line RWLA1, and the drain is connected to the bit line BLA1. One end of the ferroelectric capacitor RCA1 is connected to the source of the selection transistor RTA1, while the other end is connected to the plate line PRLA. And the gate of the precharge transistor RPCTA1 is connected to the precharge line RPCHGA, the source is connected to the selection transistor RTA1, and the drain is grounded.

The same structure is employed for the memory cells in the other blocks 510-B and 510-C.

Figure 15:
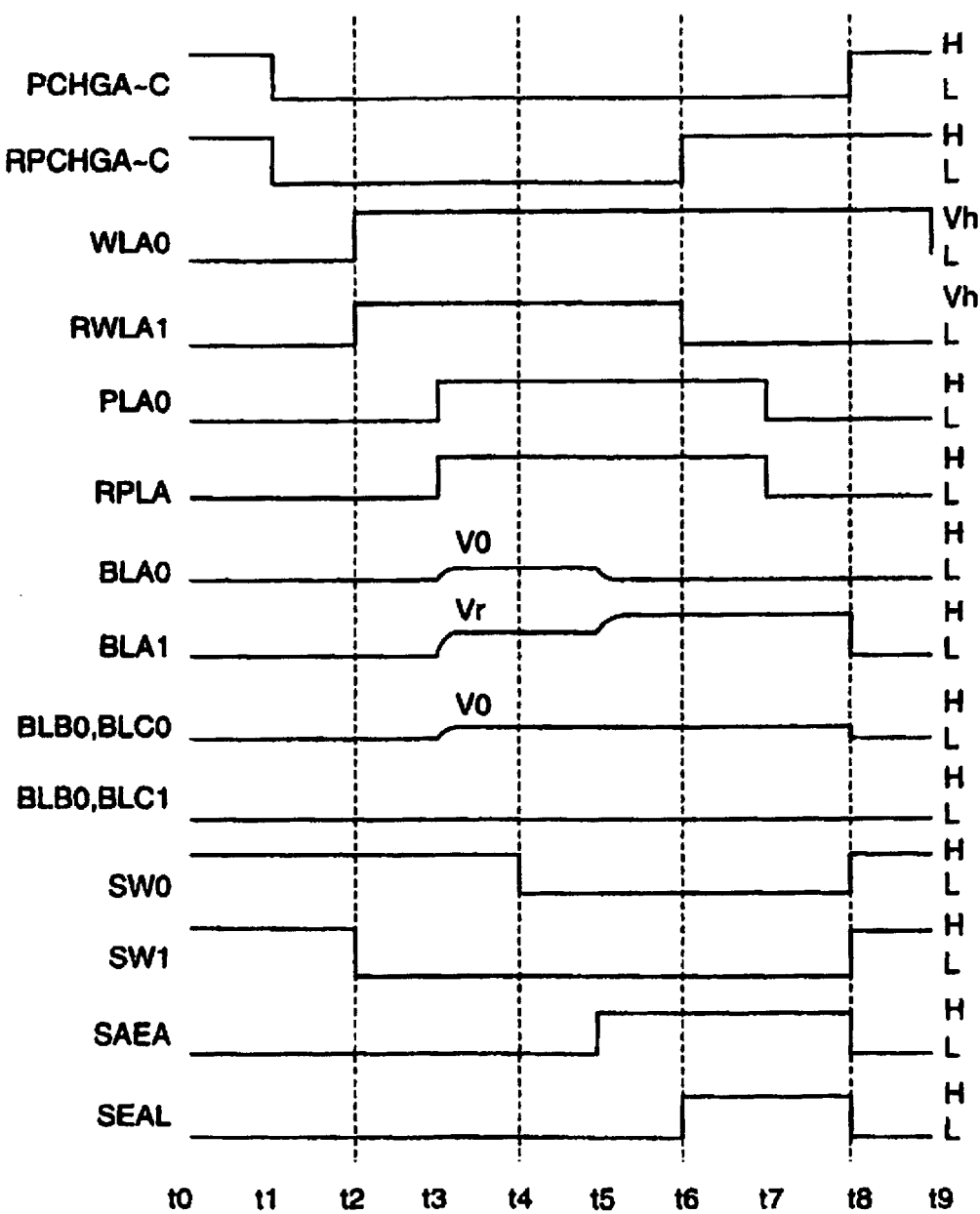
FIG. 15 is a timing chart for explaining the operation of the ferroelectric memory device according to the seventh embodiment of the present invention.

The reading operation performed using the FeRAM 1400 in FIG. 14 will now be described by employing the timing chart in FIG. 15. In this embodiment, an explanation will be given for a case wherein data is read from the memory cells MA0 and MA1. In FIG. 15, L denotes a ground potential and H denotes a power voltage Vcc. Vh denotes a potential that is higher than the power voltage Vcc by a value that corresponds to the threshold value Vt of the transistors TU0 and TU1 in the memory cell.

To read data from the memory cells MA0 and MA1, RM1 is employed as a reference memory cell.

In the initial state (time t0), the potentials on the switching control lines SW0 and SW1 are at level H. Since the switch transistors SWAT0, SWBT0, . . . and SWAT1, SWBT1, . . . are on, the bit lines BLA0, BLB0, BLC0, . . . are connected together, as are the bit lines BLA1, BLB1, BLC1.

In order to read data from the memory cell MU0, first, at time t1 the potentials of the precharge control lines PCHGA, PCHGB, PCHGC, . . . are set to level L, so that the bit lines BLA0, BLB0, BLC0, . . . and BL1A, BLB1, BLC1, . . . are set to the floating state. In addition, at time t1, the potentials on the reference precharge control lines RPCHGA, RPCHGB, RPCHGC, . . . are set to level L, and therefore, since the precharge transistors RPCTA1, RPCTB1, RPCTC1, . . . are rendered off, the contact points of the drains of the selection transistors RTA1, RTB1, RTC1, . . . and the ferroelectric capacitors RCA1, RCB1, RCC1, . . . are also set to the floating state.

At time t2, the word line WLA0 and the reference word line RWLA1 are set to level Vh. Thus, since the transistor TA0 in the memory cell MA0 and the transistor RTA1 in the reference memory cell RM1 are rendered on, one end of the ferroelectric capacitor CA0 is connected to the bit line BLA0, while one end of the ferroelectric capacitor RCA1 is connected to the bit line BLA1. Further, at time t2 the switching control line SW1 is set to level L, and therefore, the bit line BLA1 is disconnected from the bit lines BLB1, BLC1, . . . .

Sequentially, at time t3, the plate line PLA0 and the reference plate line RPLA are set to level H. Thus, the potential on the plate line PLA0 is applied to the bit line BLA0 via the ferroelectric capacitor CA0 and the transistor TA0, and the potential on the reference plate RPLA is applied to the bit line BLA1 via the ferroelectric capacitor RCA1 and the transistor RTA1. As a result, a read potential (V0 or V1) is generated at the bit line BLA0, and the reference potential Vr is generated on the bit line BLA1.

At time t4, the switching control line SW0 is set to level L. Then, since the switch transistor SWAT0 is rendered off, the bit line BLA0 is disconnected from the bit lines BLB0, BLC0, . . . . Therefore, the parasitic capacitance on the bit line BLA0 is reduced compared with when the switch transistor SWAT0 is on.

At time t5, the signal SAEA is set to level H, and the sense amplifier SAA is activated. As a result, the potential difference between the bit lines BLA0 and BLA1 is amplified. In this embodiment, since the parasitic capacitances on the bit lines BLA0 and BLA1 are small at time amplification occurs, only a small current is supplied by the sense amplifier SAA to the bit lines BLA0 and BLA1, and accordingly, the power consumed by the sense amplifier SAA is low.

At time t6, the bit line selection signal line SELA is set to level H. Then, the transistors SETA0 and SETA1 are rendered on and the potentials on the bit lines BLA0 and BLA1 are output to a data bus 520. Also, at time t6 the reference word line RWLA1 is set to level L, and the reference precharge line RPCHGA is set to H. As a result, the value stored in the reference memory cell RMA0 is a constant 0.

At time t7, the potentials on the plate line PLA0 and the reference plate line RPLA0 are returned to level L.

At time t8, the potentials on the precharge control lines PCHGA, PCHGB, PCHGC, . . . are returned to level H. and the potentials of the signals SAEA and SELA are set to level L. As a result, the bit lines BLA0, BLB1, BLC0, . . . and BLA1, BLB21, BLC1, . . . are grounded, and the sense amplifier SAA halts the output of read data. Also, at time t8 the switching control lines SW0 and SW1 are returned to level H. Thus, the bit lines BLA0, BLB0, BLC0, . . . are connected together, as are the bit lines BLA1, BLB1, BLC1, . . . .

At time t9, the potential on the word line WLA0 is set to level L, the transistor TA0 is rendered off, and the reading operation is terminated.

The operation performed to read data from the other memory cells in the first block 510-A and the memory cells in the other blocks 510-B and 510-C is performed substantially the same as it is for the memory cells MA0 and MA1.

As is described above, according to the embodiment, a 1-transistor 1-capacitor/1-bit type FeRAM can be provided with which the satisfactorily large reading margin $\Delta V$ is obtained and the power consumed by the sense amplifier is low.

In addition, in this embodiment, as in the fifth embodiment, since the value stored in the reference memory cell is 0, deterioration of the FeRAM does not occur easily.

Eighth Embodiment

An explanation will now be given for a semiconductor device according to an eighth embodiment of the present invention. In this embodiment, the FeRAM 700 for the fourth embodiment (see FIG. 7) is modified to provide a 1-transistor 1-capacitor/1-bit type FeRAM.

Figure 16:
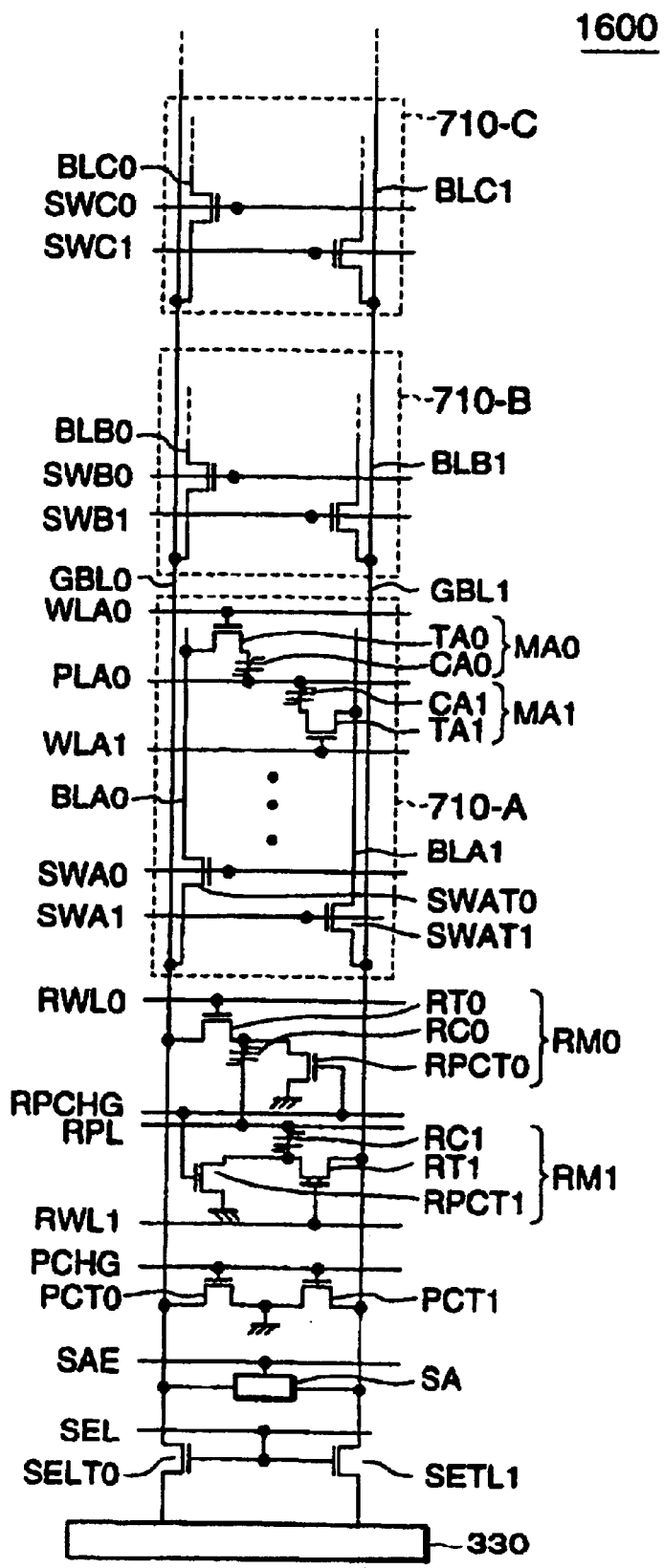
FIG. 16 is a diagram showing the configuration of a ferroelectric memory device according to an eighth embodiment of the present invention.

FIG. 16 is a circuit diagram for one column of a memory cell array for the FeRAM according to the embodiment. In FIG. 16, the same reference numerals as are used in FIG. 7 are used to denote corresponding components.

As is shown in FIG. 16, the memory cell array of an FeRAM 1600 includes switching control lines for each of blocks 710-A, 710-B, 710-C, . . . . For example, switching control lines SWA0 and SWA1 are provided for the first block 710-A; switching control lines SWB0 and SWB1 are provided for the second block 710-B; and switching control lines SWC0 and SWC1 are provided for the third block 710-C. For the first block 710-A, the switching control line SWA0 is connected to the gate of the switch transistor SWAT0 of each column, and the switching control line SWA1 is connected to the gate of the switch transistor SWAT1. The same switch transistors are provided for the other blocks 710-B and 710-C.

The memory cell array of the FeRAM 1600 includes two reference memory cells RM0 and RM1. In addition, the FeRAM 1600 includes two reference word lines RWL0 and RWL1, one reference plate line RPL, and one reference precharge line RPCHG.

The reference memory cell RM0 includes a selection transistor RT0, a ferroelectric capacitor RC0 and a precharge transistor RPCT0. For the selection transistor RT0, the gate is connected to the reference word line RWL0, and the drain is connected to the global bit line GBL0. For the ferroelectric capacitor RC0, one end is connected to the source of the selection transistor RT0, and the other end is connected to the plate line RPL. For the precharge transistor RPCT0, the gate is connected to the precharge line RPCHG, the source is connected to the source of the selection transistor RT0, and the drain is grounded.

Similarly, the reference memory cell RM1 includes a selection transistor RT1, a ferroelectric capacitor RC1 and a precharge transistor RPCT1. For the selection transistor RT1, the gate is connected to the reference word line RWL1, and the drain is connected to the bit line BL1. For the ferroelectric capacitor RC1, one end is connected to the source of the selection transistor RT1, and the other end is connected to the plate line RPL. For the precharge transistor RPCT1, the gate is connected to the precharge line RPCHG, the source is connected to the source of the selection transistor RT1, and the drain is grounded.

Figure 17:
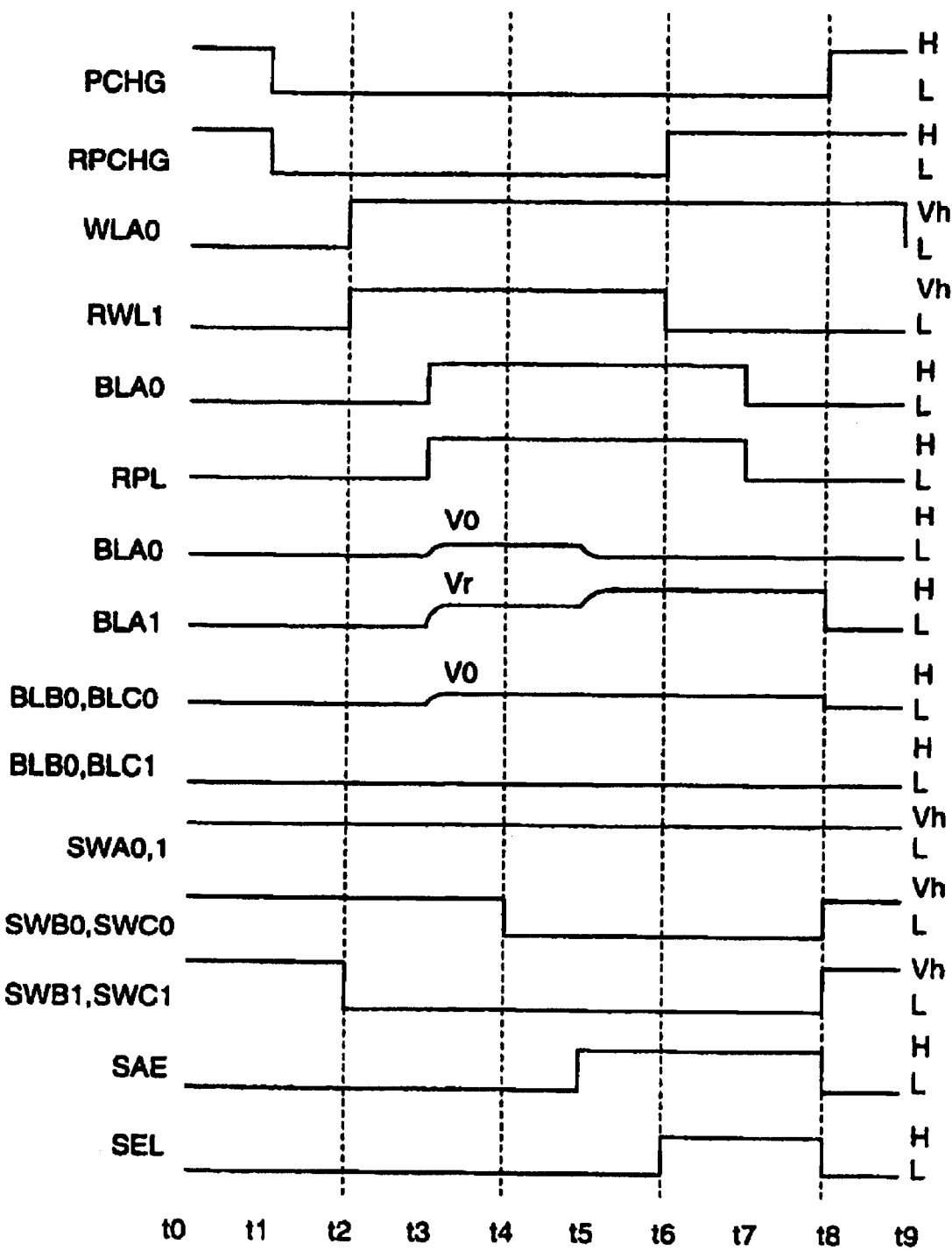
FIG. 17 is a timing chart for explaining the operation of the ferroelectric memory device according to the eighth embodiment of the present invention.
Figure 18:
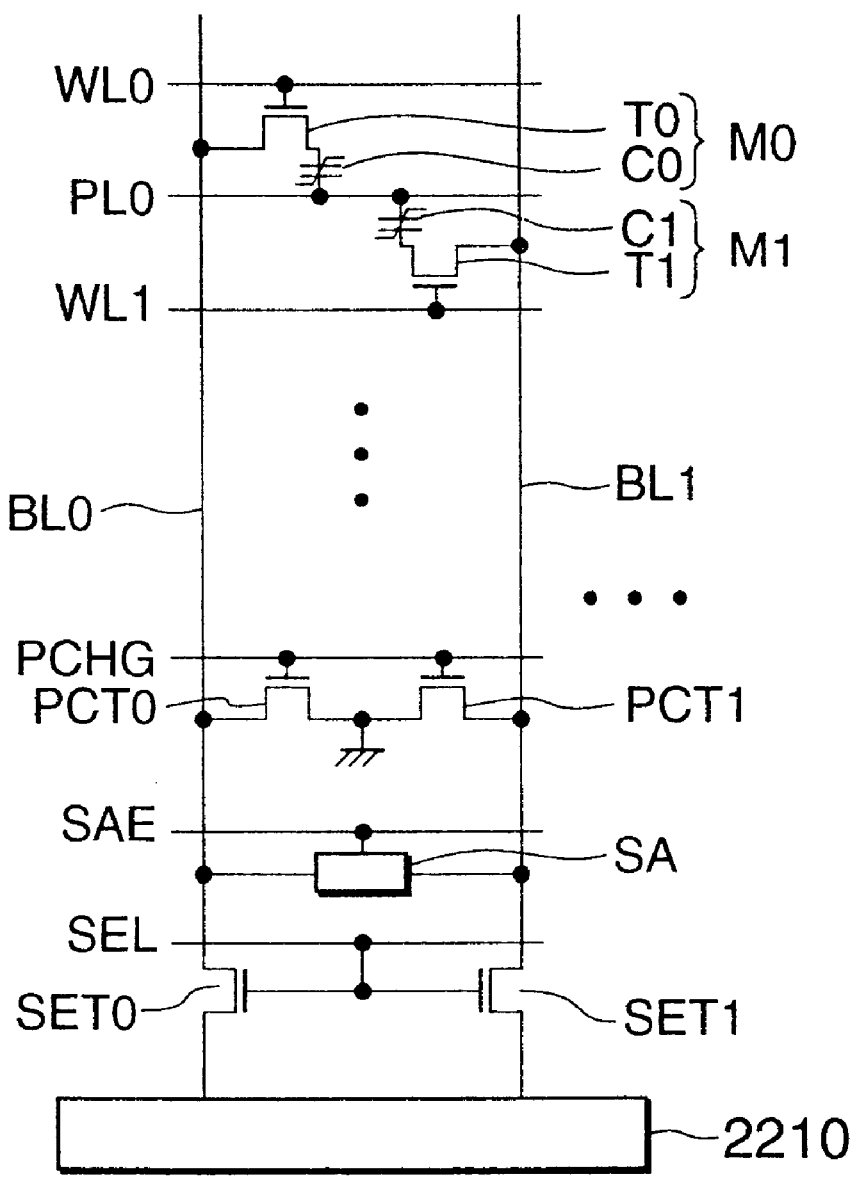
FIG. 18 is a diagram showing the configuration of a conventional ferroelectric memory device.
Figure 19:
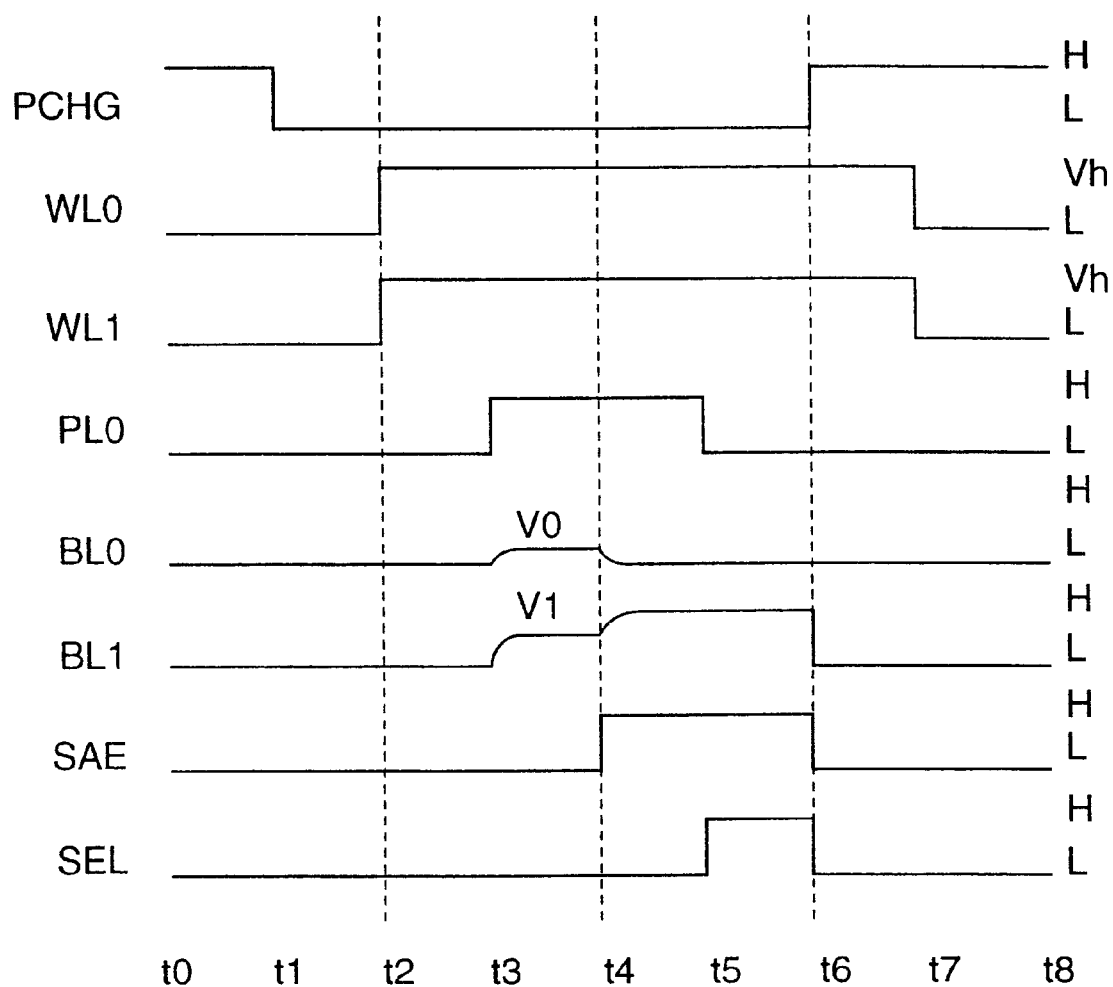
FIG. 19 is a timing chart for explaining the operation of the conventional ferroelectric memory device.
Figure 20:
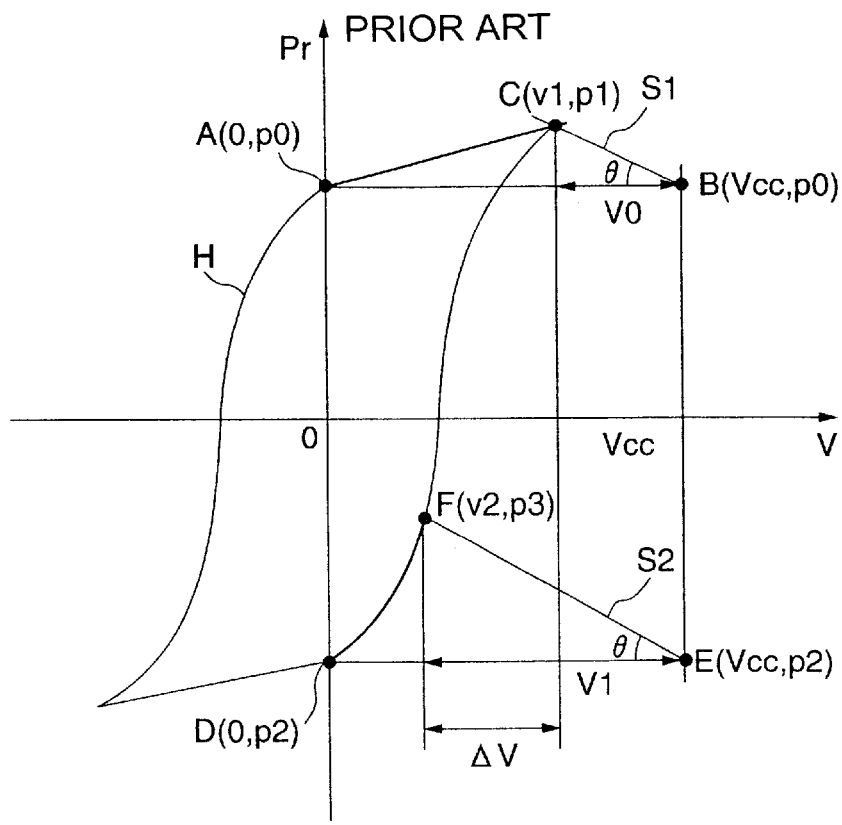
FIG. 20 is a diagram for explaining the state shifting of a capacitor using a ferroelectric substance.

The reading operation performed for the FeRAM 1600 in FIG. 16 will now be described by using the timing chart in FIG. 17. In this embodiment, an explanation will be given for a case wherein data is read from the memory cells MA0 and MA1. In FIG. 17, L denotes a ground potential and H denotes a power voltage Vcc, and Vh denotes a potential that is higher than the power voltage Vcc by an amount that corresponds to the threshold value Vt of the transistors T0 and T1 in the memory cell.

To read data from the memory cells MA0 and MA1, RM1 is employed as a reference memory cell.

In the initial state (time t0), the potentials on the switching control lines SWA0, SWB0, SWC0, . . . and SWA1, SWB1, SWC1, . . . are at level H. Therefore, the bit lines BLA0, BLB0, BLC0, . . . are connected to the global bit line GBL0, and the bit lines BLA1, BLB1, BLC1, . . . are connected to the global bit line GBL1.

In order to read data from the memory cell MA0, first, at time t1 the potential on the precharge control line PCHG is set to level L. Thus, since the transistors PCT0 and PCT1 are rendered off, the global bit lines GBL0 and GBL1 are set to the floating state. In addition, at time t1, the potential on the reference precharge control line RPCHG is set to level L. Therefore, since the precharge transistor RPCT1 in the reference memory cell RM1 is rendered off, the contact point of the drain of the selection transistor RT1 and the ferroelectric capacitor RC1 is also set to the floating state.

At time t2, the word line WLA0 and the reference word line RWL1 are set to level Vh. Thus, since the transistor TA0 in the memory cell MA0 and the transistor RT1 of the reference memory cell RM1 are rendered on, one end of the ferroelectric capacitor CA0 is connected to the bit line BLA0, while one end of the ferroelectric capacitor RC1 is connected to the global bit line GBL1. Further, at time t2, the switching control lines SWB1, SWC1, . . . are set to level L. Therefore, the bit lines BLB1, BLC1, . . . are disconnected from the global bit line GBL1.

Sequentially, at time t3, the plate line PLA0 and the reference plate line RPL are set to level H. Thus, the potential on the plate line PLA0 is applied to the bit line BLA0 (i.e., the global bit line GBL0) via the ferroelectric capacitor CA0 and the transistor TA0, and the potential on the reference plate RPL is applied to the global bit line GBL1 via the ferroelectric capacitor RC1 and the transistor RT1. As a result, the read potential (V0 or V1; V0 for the example in FIG. 13) is generated on the bit line BLA0, and the reference potential Vr is generated on the bit line BLA1.

At time t4, the switching control lines SWB0, SWC0, . . . are set to level L, and thus, the bit lines BLB0, BLC0, . . . are disconnected from the global bit line GBL0. Therefore, the parasitic capacitance on the global bit line GBL0 is reduced.

At time t5, the signal SAE is set to level H, and the sense amplifier SA is activated. As a result, the potential difference between the global bit lines GBL0 and GBL1 is amplified. In this embodiment, since the parasitic capacitances on the global bit lines GBL0 and GBL1 are small at the time amplification is performed, only a small current is supplied by the sense amplifier SA to the global bit lines GBL0 and GBL1, and accordingly, the power consumed by the sense amplifier SA is low.

At time t6, the bit line selection signal line SEL is set to level H. Then, the transistors SET0 and SET1 are rendered on and the potentials on the global bit lines GBL0 and GBL1 are output to a data bus 330. Also at time t6, the reference word line RWL1 is set to level L and the reference precharge line RPCHG is set to H. As a result, the value stored in the reference memory cell RM0 is a constant 0.

At time t7, the potentials on the plate line PLA0 and the reference plate line RPL are returned to level L.

At time t8, the potential on the precharge control line PCHG is returned to level H, and the potentials on the signals SAE and SEL are set to level L. As a result, since the transistors PCT0 and PCT1 are rendered on, the global bit lines GBL0 and GBL1 are grounded, and the sense amplifier SA halts the output of read data. Also, at time t8 the switching control lines SWB0, SWC, . . . and SWB1, SWC1, . . . are returned to level H. Therefore, the bit lines BLB0, BLC0, . . . are connected to the global bit line GBL0, and the bit lines BLB1, BLC1, . . . are connected to the global bit line GBL1.

At time t9, the potential of the word line WLA0 is set to level L, the transistor TA0 is rendered off, and the reading operation is terminated.

Substantially the same reading operation as for the memory cells MA0 and MA1 is performed for reading the data from the other memory cells in the first block 710-A and the memory cells in the other blocks 710-B and 710-C.

As is described above, according to the embodiment, a 1-transistor 1-capacitor/1-bit type FeRAM can be provided for which a satisfactorily large reading margin ΔV can be obtained and the power consumed by the sense amplifier is low.

In addition, in this embodiment, since the value stored in the reference memory cell is 0, deterioration of the FeRAM does not easily occur, for the same reasons as were given in the fifth embodiment.

What is claimed is:

1. A ferroelectric memory device comprising:
    a plurality of memory cells, arranged in the shape of a matrix, including capacitors, for which a ferroelectric substance is used, on which binary data is stored while said capacitors are in a polarized state;
    a plurality of bit lines, connected to several of said memory cells aligned in a first direction, said plurality of bit lines comprising first bit lines and second bit lines;
    a plurality of word lines, connected in series to said memory cells aligned in a second direction perpendicular to said first direction;
    a plurality of plate lines, which correspond to said memory cells and which are electrically connected to said capacitors;
    a sense amplifier for amplifying a potential applied to each of said bit lines; and
    a controller to place said first bit lines in a conductive state with said second bit lines when data is read from one of said memory cells coupled to said first bit lines and to place said first bit lines in a non-conductive state with said second bit lines when said sense amplifier amplifies a potential between the bit lines of said first bit lines.

2. A ferroelectric memory device according to claim 1, wherein each of said bit lines is divided into a plurality of line segments, to each of which one or more of said memory cells are electrically connected, and to which said sense amplifier is electrically connected;
    wherein said controller has a switch for changing electrical connections between said line segments; and
    wherein said switch electrically connects said line segments when data is read from one of said memory cells coupled to said first bit lines and said switch electrically disconnects said line segments when said sense amplifier amplifies a potential between the bit lines of said first bit lines.

3. A ferroelectric memory device according to claim 2, wherein said sense amplifier amplifies a potential difference between two adjacent bit lines among said plurality of bit lines.

4. A ferroelectric memory device according to claim 3, wherein data that complement each other are stored in memory cells connected to said two adjacent bit lines.

5. A ferroelectric memory device according to claim 3, further comprising:
    a reference potential supplying circuit for outputting a reference potential,
    wherein, when a potential from a memory cell is output to one of said two adjacent bit lines, said reference potential supplying circuit supplies said reference potential to the other bit line.

6. A ferroelectric memory device according to claim 1, wherein each of said bit lines is composed of a plurality of support lines that are electrically connected to one or more memory cells, and a plurality of main lines that are electrically connected to said support lines, and said sense amplifier is connected so as to amplify the potential on said main lines;
    wherein said controller has a switch for changing electrical connections between said support lines and said main lines; and
    wherein said switch electrically connects said support lines and said main lines when data is read from one of said memory cells coupled to said first bit lines and said switch electrically disconnects said support lines and said main lines when said sense amplifier amplifies a potential between the bit lines of said first bit lines.

7. A ferroelectric memory device according to claim 1, wherein said sense amplifier amplifies a potential difference between two adjacent bit lines among said plurality of bit lines.

8. A ferroelectric memory device according to claim 7, wherein data that complement each other are stored in memory cells connected to said two adjacent bit lines.

9. A ferroelectric memory device according to claim 7, further comprising:
    a reference potential supplying circuit for outputting a reference potential,
    wherein, when a potential from a memory cell is output to one of said two adjacent bit lines, said reference potential supplying circuit supplies said reference potential to the other bit line.

10. A ferroelectric memory device according to claim 9, wherein said reference potential supplying circuit includes:
    reference memory cells provided for said plurality of bit lines;
    reference word lines used to control said reference memory cells and output said reference potential to said bit lines; and
    a reference plate line electrically connected to said reference memory cell.

11. A ferroelectric memory device according to claim 10, wherein said reference memory cell includes a capacitor using a ferroelectric substance, and wherein the positive side of said capacitor is polarized.

12. A ferroelectric memory device according to claim 5, wherein said reference potential supplying circuit includes:
    reference memory cells provided for said plurality of bit lines;
    reference word lines used to control said reference memory cells and output said reference potential to said bit lines; and
    a reference plate line electrically connected to said reference memory cells.

13. A ferroelectric memory device according to claim 12, wherein said reference memory cell includes a capacitor using a ferroelectric substance, and wherein the positive side of said capacitor is polarized.

14. A ferroelectric memory device comprising:
    a plurality of memory cells arranged as a matrix, said plurality of memory cells comprising a first memory cell and a second memory cell, said first memory cell comprising a first capacitor, said first capacitor comprising ferroelectric substance, said second memory cell comprising a second capacitor, said second capacitor comprising ferroelectric substance;
    a plurality of bit lines aligned in a first direction, said plurality of bit lines comprising a first pair of bit lines and a second pair of bit lines, said first pair of bit lines coupled to said first memory cell, said second pair of bit lines coupled to said second memory cell;
    a plurality of word lines aligned in a second direction perpendicular to said first direction, said plurality of word lines coupled to said memory cells;

a plurality of plate lines coupled to said memory cells, said plurality of plate lines coupled to said first and second capacitors;

sense amplifier circuitry coupled to said first and second pairs of bit lines; and a controller coupled to said first and second pairs of bit lines to selectively electrically connect said first and second pairs of bit lines.

15. A ferroelectric memory device according to claim 14, wherein said controller electrically connects said first and second pairs of bit lines when data is read from said first memory cell to said first pair of bit lines and electrically disconnects said first and second pairs of bit lines when said sense amplifier circuitry amplifies a potential between the bit lines of said first pair of bit lines.

16. A ferroelectric memory device according to claim 14, wherein said controller comprises switch circuitry coupled between said the bit lines of said first pair of bit lines.

17. A ferroelectric memory device according to claim 14, wherein said plurality of bit lines comprise a global pair of bit lines coupled to said first and second pairs of bit lines, said sense amplifier circuitry coupled to said global pair of bit lines, said controller selectively electrically connects said first and second pairs of bit lines via said global pair of bit lines.

18. A ferroelectric memory device according to claim 14, further comprising:

a reference potential supplying circuit to output a reference potential, wherein, when data is read from said first memory cell to one line of said first pair of bit lines, said reference potential supplying circuit supplies said reference potential to the other bit line of said first pair of bit lines.

19. A ferroelectric memory device according to claim 18, wherein said reference potential supplying circuit comprises:

a plurality of reference memory cells;

a plurality reference word lines to control said reference memory cells and output said reference potential to said first pair of bit lines; and a reference plate line electrically connected to said reference memory cells.

* * * * *